United States Patent
Benitez et al.

(10) Patent No.: US 9,123,849 B2
(45) Date of Patent: Sep. 1, 2015

(54) PHOTOVOLTAIC DEVICE

(75) Inventors: Pablo Benitez, Madrid (ES); Juan Carlos Miñano, Madrid (ES); Rubén Mohedano, Madrid (ES); Waqidi Falicoff, Stevenson Ranch, CA (US)

(73) Assignee: Light Prescriptions Innovators, LLC, Altadena, CA (US)

( * ) Notice: Subject to any disclaimer, the term of this patent is extended or adjusted under 35 U.S.C. 154(b) by 694 days.

(21) Appl. No.: 12/766,298

(22) Filed: Apr. 23, 2010

(65) Prior Publication Data

US 2010/0269885 A1    Oct. 28, 2010

Related U.S. Application Data

(60) Provisional application No. 61/214,548, filed on Apr. 24, 2009, provisional application No. 61/214,739, filed on Apr. 27, 2009, provisional application No. 61/270,474, filed on Jul. 9, 2009, provisional application No. 61/270,612, filed on Jul. 10, 2009.

(51) Int. Cl.
*H01L 31/052*     (2014.01)
*H01L 31/054*     (2014.01)
*H01L 31/0687*    (2012.01)

(52) U.S. Cl.
CPC ........ *H01L 31/0543* (2014.12); *H01L 31/0547* (2014.12); *H01L 31/0687* (2013.01); *Y02E 10/52* (2013.01)

(58) Field of Classification Search
CPC ............ H01L 31/0547; H01L 31/0543; H01L 31/0687; Y02E 10/52
USPC ................................. 136/243–251
See application file for complete search history.

(56) References Cited

U.S. PATENT DOCUMENTS 4,695,674 A  *  9/1987  Bar-on ...................... 136/256
5,291,331 A       3/1994  Miano et al. .............. 136/259

(Continued)

FOREIGN PATENT DOCUMENTS

| JP | H 08-078705 A | 3/1996 | ............ H01L 31/04 |
| JP | 2003-197936 A | 7/2003 | ............ H01L 31/04 |
| JP | 2006-120747 A | 5/2006 | ............ H01L 31/04 |

OTHER PUBLICATIONS

Allen Barnett et al., "Very High Efficiency Solar Cell Modules", Prog. Photovolt: Res. Appl. 2009; 17:75-83; Published online: Oct. 1, 2008 in Wiley InterScience (www.interscience.wiley.com) DOI: 10.1002/pip.852.

(Continued)

*Primary Examiner* — Matthew Martin
(74) *Attorney, Agent, or Firm* — Drinker Biddle & Reath LLP

(57) ABSTRACT

Some photovoltaic cells have a front face accepting incoming incident light and opaque gridlines overlying part of the front face, electrically bonded to the face, with upper reflective facets oblique to the plane of the front face and producing outgoing reflected light. An optical interface parallel to and in front of the front face transmits incoming light to the front face and to the gridlines and reflects back towards the front face by total internal reflection at least some of the outgoing reflected light. Some photovoltaic devices have a triple junction photovoltaic cell, a single junction photovoltaic cell, and a reflective surface arranged to distribute incoming light between the cells. The surface may be a frequency-selective mirror that apportions light so when the cells are in series the power produced, and preferably the photocurrent, is greater than if all the light fell on the triple junction cell alone.

24 Claims, 21 Drawing Sheets

(56) References Cited

U.S. PATENT DOCUMENTS

| | | | | |
|---|---|---|---|---|
| 5,902,417 | A * | 5/1999 | Lillington et al. | 136/246 |
| 7,619,159 | B1 * | 11/2009 | Ortabasi | 136/246 |
| 2002/0195137 | A1 * | 12/2002 | King et al. | 136/249 |
| 2004/0093809 | A1 * | 5/2004 | Winarski | 52/173.3 |
| 2006/0086386 | A1 | 4/2006 | Nakano et al. | 136/255 |
| 2008/0163920 | A1 * | 7/2008 | Meusel et al. | 136/246 |
| 2009/0056789 | A1 * | 3/2009 | Draganov | 136/246 |
| 2009/0116114 | A1 | 5/2009 | Falicoff | 359/588 |
| 2009/0199889 | A1 * | 8/2009 | Willmott | 136/246 |

OTHER PUBLICATIONS

James D. McCambridge et al., "Compact spectrum splitting photovoltaic module with high efficiency", Prog. Photovolt: Res. Appl. 2011; 19:352-360; Published online: Sep. 24, 2010 in Wiley Online Library (wileyonlinelibrary.com) DOI: 10.1002/pip.1030.

"High Efficiency Photovoltaic Conversion with Spectrum Splitting on GaAs and Si Cells Located in Light Confining Cavities", A. Marti, et al., Institue de Energia Solar, ETSI de Telecomunicacion—UPM; 1993 IEEE, pp. 768-773.

"Light-Confining Cavities for Photovoltaic Applications Based on the Angular-Spatial Limitation of the Escaping Beam", J.C. Minano, et al., Applied Optics, vol. 31, No. 16, Jun. 1, 1992, pp. 3114-3122.

"New Ideas for the Practical Achievement of Efficiencies Over 35%", A. Luque, etl., Institue de Energia Solar ETSI Telecomunicacion, Photovoltaic Solar Energy Conference, Proceedings of the International Conference, held at Freidburg, Fed. Rep. of Germany, Sep. 25-29, 1989, Commission of the European Communities, pp. 802-805.

"The Photovoltaic Eye: A High Efficiency Converter Based on Light Trapping and Spectrum Splitting", A. Luque, et al., Instituto de Energia, Solar, ETSI Telecomunicacion, 10th European Phtovoltaic Solar Energy Conference, pp. 627-630.

"Optical Aspects in Photovoltaic; Energy Conversion", A. Luque, et al., Solar Cells, 31 (1991), pp. 237-258.

* cited by examiner

— Silicon  —— reflectivity silicon  - - - Bottom Cell (no gridline reflection)

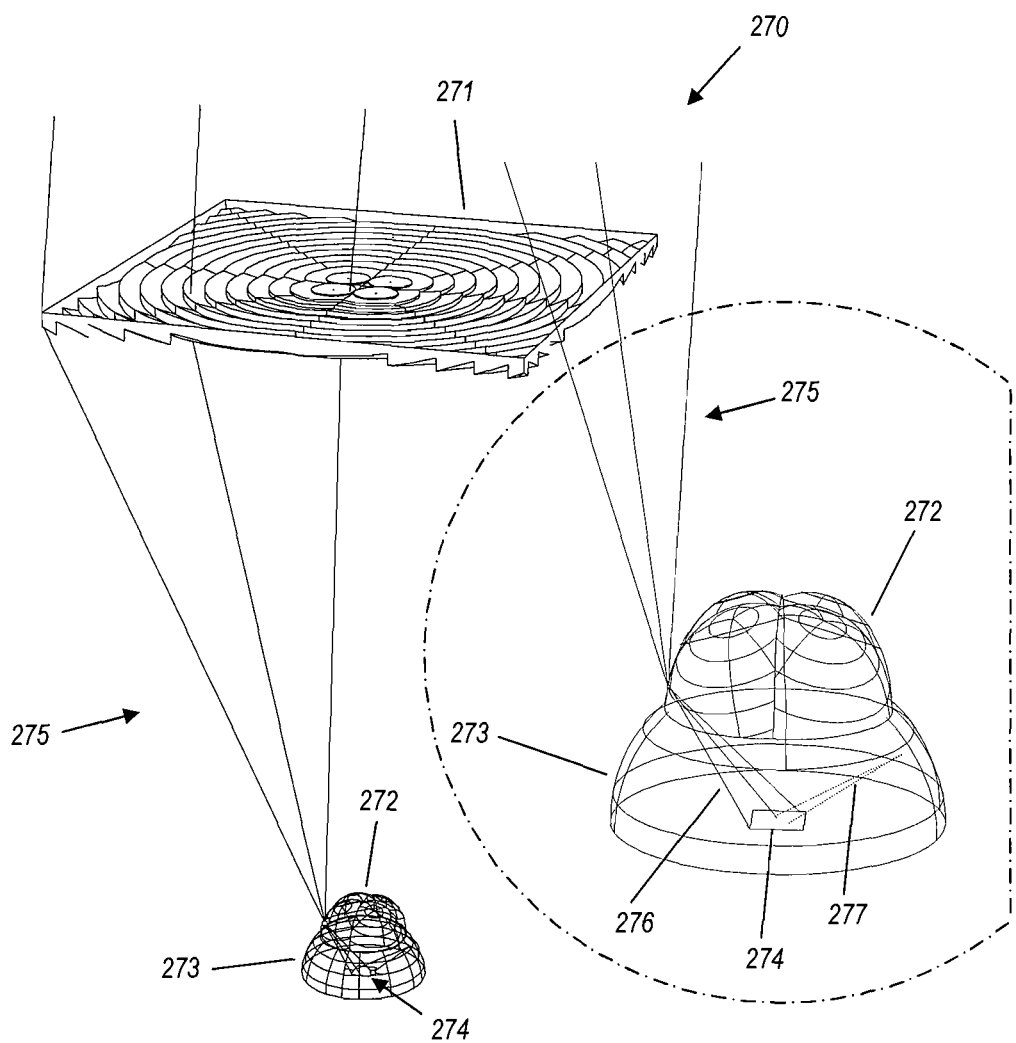
*FIG. 27*  *FIG. 28*

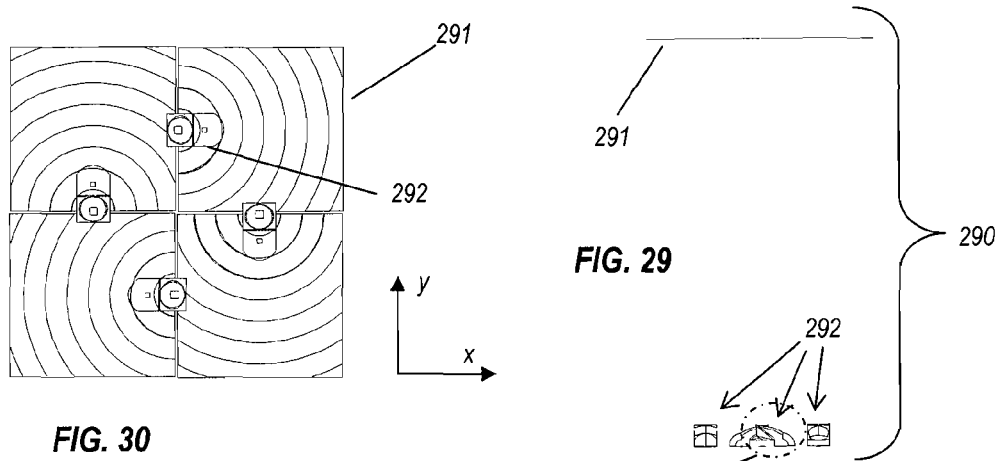
FIG. 30
FIG. 29
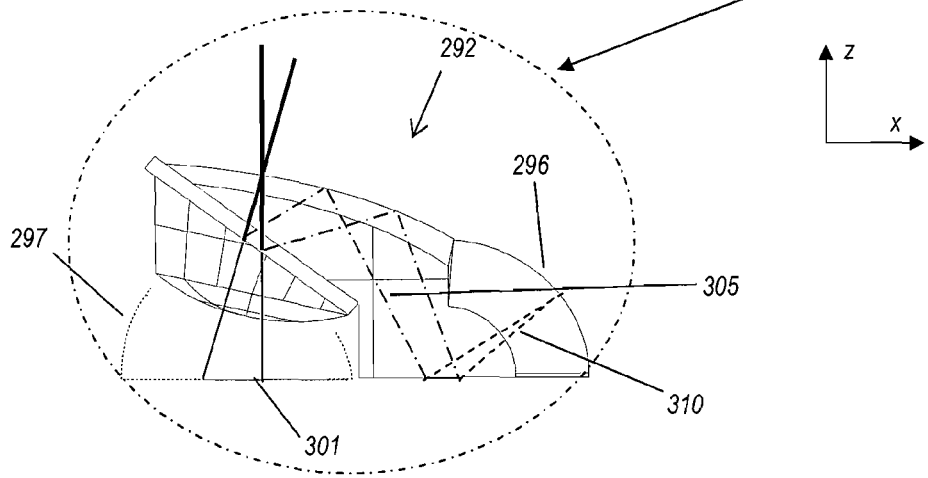
FIG. 31
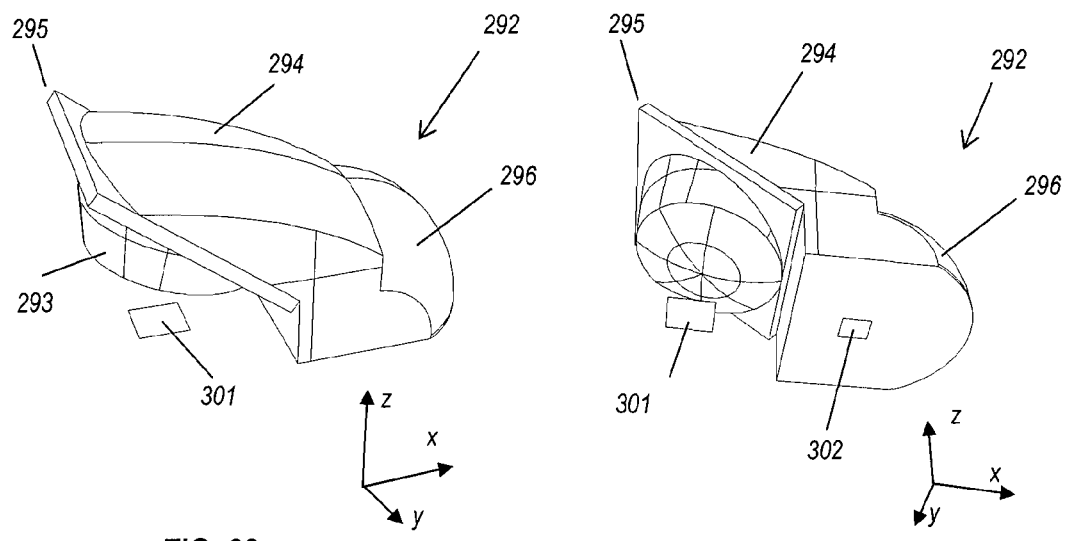
FIG. 32
FIG. 33

PHOTOVOLTAIC DEVICE

CROSS REFERENCE TO RELATED APPLICATIONS

This application claims benefit from U.S. Provisional Patent Applications No. 61/214,548, filed Apr. 24, 2009 and No. 61/214,739, filed Apr. 27, 2009, both in the name of Benítez and Miñano, and from U.S. Provisional Patent Applications No. 61/270,474, filed Jul. 9, 2009 and No. 61/270,612, filed Jul. 10, 2009, both in the name of Benítez, Miñano, Mohedano, and Falicoff. All four of those prior applications are incorporated herein by reference in their entirety.

This application references the following earlier U.S. patents and applications, which are incorporated herein by reference in their entirety: U.S. Pat. No. 5,291,331 issued Mar. 1, 1994 to Miñano and Luque for "Light confining cavity with angular-spatial limitation of the escaping beam"; U.S. published patent application no. 2008/0223443 of Benitez et al., published Sep. 18, 2008 for "Optical concentrator, especially for solar photovoltaics"; U.S. published Patent Applications No. 2008/0000516 published Jan. 3, 2008 and No. 2005/0046977 published Mar. 3, 2005, both of E. Shifman, for "Solar energy utilization unit and solar energy utilization system"; U.S. patent application Ser. No. 12/621,047 and corresponding International Patent Application No. PCT/US09/64887, both filed Nov. 18, 2009 by Benítez et al. for "Kohler concentrator azimuthally combining radial-Kohler sub-concentrators."

TECHNICAL FIELD

The present invention relates generally to photovoltaic solar energy.

BACKGROUND

Photovoltaic solar electricity is produced by means of a converter of the light of the sun into electrical energy. Today, different types of solar cells achieve this conversion at different levels of efficiency. For example, commercial crystalline flat-panel silicon solar cells attain 15% to 20% efficiency, depending upon the manufacturer, without concentration. More sophisticated (and expensive) multi-layer cells are more efficient, particularly working under concentrated sunlight. In the case of silicon solar cells, the most efficient are the Back-Point-Contact (BPC) cells, which have gone above 27% cell efficiency, under irradiance levels around 10 W/cm$^2$.

The highest efficiencies have been obtained with solar cells based on III-V semiconductor materials, with commercial cells in the 35-40% range, formed by three current-generating junctions stacked in tandem in a monolithic configuration, grown by Metal-Organic Chemical Vapor Deposition (MOCVD) on a semiconductor substrate. Today's standard commercial process uses a Germanium (Ge) substrate on which are grown a stack of lattice-matched semiconductor layers: a Ge bottom junction, a Ga(In)As middle junction, and a GaInP top junction. The higher the desired efficiency, however, the greater the number of layers and hence the higher the cost. Today, bare cell costs are in the $100-200/m$^2$ range for thin film solar cells, $300-500/m$^2$ for flat-panel silicon cells, $20,000-40,000/m$^2$ for BPC cells, and $50,000-100,000/m$^2$ for III-V multi-layer solar cells. Therefore, the electricity produced by the very high efficiency cells (such as the triple junction cells) cannot be competitive at one sun irradiance with electricity produced by cheaper low efficiency cells (except in outer space). Only when an optical concentrator reduces the necessary cell area does cost competition become possible. Typical geometrical concentration ratios (i.e., ratio of the entry aperture area to the cell area) for high-efficiency high concentration silicon and III-V solar cells range from 200 to 1,000.

The high concentration required for these high efficiency cells produces correspondingly higher current densities as compared to one-sun cells. In the case of III-V solar cells, designing for the highest efficiency requires an optimization that balances the characteristics of the various layers so they all work well on the identical current going through them. In the case of III-V solar cells, these parameters include the series resistance joule losses, the recombination at the metal-semiconductor ohmic contacts, and the front metal grid shading factor. In today's optimized III-V solar cells, the main cause of losses in the device is grid line shading, which is about 8-10%.

As an example of suitable dimensions, the gridlines may be 5 μm high, 10 μm wide at the base, and spaced apart at 75 μm center-to-center pitch. The gridlines may be formed by photoresist etching.

Recovering the light reflected by the grid lines has been a subject of prior art. U.S. Pat. No. 4,711,972 by O'Neill disclosed refractive microlenses aligned over the grid lines to refract the light away from them. Such small devices, however, are difficult and expensive to align over the gridlines. These microlenses, further, are not effective under wide-angle illumination (as occurs in high concentration systems), especially when a secondary optical element (SOE) is optically coupled to the cell as a concentrator or homogenizer.

Another approach, in principle compatible with wide-angle illumination, is optically coupled secondary optical elements (SOE), which was suggested in Chapter 14 of Luque's 1989 book "Solar Cells and Optics for Photovoltaic concentration." In this approach, the grid lines must be shaped to reflect the light impinging on them towards the uncovered semiconductor (A. Luque et al., *Progress in Photovoltaics: Research and Applications*, Volume 12, Issue 7, Pages 517-528, 2004). Similarly, TIR vs.-groove microconcentrators have been proposed (EU project Euclides, also Omer Korech et al., *Optics Letters*, Vol. 32, Issue 19, pp. 2789-2791, 2007). In these microconcentrator concepts, the recovered light eventually reaches the semiconductor, but at very high incidence angles, for which the cell reflectivity is high (in spite of the cell surface being antireflection (AR) coated).

Finally, U.S. Pat. No. 5,291,331 by Miñano and Luque disclosed rotationally symmetric elliptical reflectors as external reflective angular-confining cavities that collect the light reflected by the grid lines (as well as Fresnel reflections from the semiconductor front surface) of one cell and then redirect it back to that cell or to another cell placed nearby.

Multiple combinations of silicon and III-V solar cells with such cavities have been considered (A. Luque, G. Sala, J. C. Miñano, P. A. Davies, I. Tobías, J. Alonso, C. Algora, G. L. Araújo, J. M. Ruiz, A. Cuevas, J. Oliván, P. Dunn, G. Rice. J. Knobloch, B. Voss and C. Flores: *The photovoltaic eye: a high efficiency converter based on light trapping and spectrum splitting*, 10th European PV Solar Energy Conf., Lisbon, 627-630 (1991).

Spectrum splitting is discussed by E. Shifman in U.S. Patent Applications Nos. 2008/0000516 and 2005/0046977, in an on-axis Cassegrain concentrator with a parabolic primary mirror and a hyperbolic secondary mirror. The spectrum-splitting filter is on the secondary mirror, and the two cells are located in parallel planes, facing one another on opposite sides of the secondary mirror.

SUMMARY OF THE INVENTION

It is an aspect of certain embodiments of the present invention to provide a device in which at least some of the light is recovered and used that in prior art devices would be lost after reflecting off the grid lines of a front collector grid. It is a further object of this invention to provide such a device that does not require alignment of components to the gridlines, and especially that does not require alignment of any other optical components with those gridlines.

It is an aspect of certain embodiments of the present invention to provide a two-terminal device that has better efficiency than existing photovoltaic devices, by collecting and directing to an additional cell at least some of the light that is not effectively used in existing devices. Such light may include any or all of: light reflected off a front collector grid; light specularly reflected off the front surface of the primary photovoltaic cell itself; and light deliberately intercepted by a frequency selective filter.

In embodiments of a multi-junction device, the junctions typically convert light of different wavelengths but are typically not perfectly matched in terms of the photocurrent they produce from an external light source of varying spectral distribution, usually daylight or sunlight. A wavelength-selective filter, such as a band-pass reflector, or a band-pass reflector with some reflection outside its passband, may then be used to divert light selectively from the over-powered junction or junctions to a secondary cell, which can more effectively use the diverted light. As will be shown below, this can be achieved using a commercially available triple-junction cell as the primary cell and a silicon cell as the secondary cell.

Embodiments of the present invention generally include a two-terminal device that could make possible improved conversion efficiency of two-terminal triple-junction solar cells. The device collects the light that the triple-junction solar cell loses by surface reflection and reflects it either back to the same solar cell or to a nearby silicon cell, to be series connected with the triple-junction cell. The sun light can be spectrally filtered in order to send to the silicon cell most of the infrared light with energy between those of the silicon and middle-cell bandgaps. Shorter wavelengths are distributed over both cells such that the four junctions are properly balanced in current, as required for an efficient series connection. This balance is achieved mainly by the proper selection of the spectrum-splitting wavelength, but also influential are the triple-junction grid-line spacing, the cross sectional shape, and the particular antireflective coatings designs for the cells.

BRIEF DESCRIPTION OF THE DRAWINGS

In the drawings:

FIG. 27 is a perspective view of a further photovoltaic device comprising a multi-segment Kohler concentrator.

FIG. 28 is a view of the secondary optics of the device of FIG. 27, to a larger scale.

FIG. 29 is a side view of a four-receiver photovoltaic concentrator.

FIG. 30 is a top view of same.

FIG. 31 is a close-up view of a receiver of same.

FIG. 32 is a perspective view from above of this receiver.

FIG. 33 is a perspective view from below of this receiver.

DETAILED DESCRIPTION OF THE DRAWINGS

Aspects of the present invention relate generally to photovoltaic devices that can achieve high conversion efficiencies by recovering light reflected by the cell, particularly that which might be lost in state of the art triple junction solar cells. One of the main sources of reflection losses are the grid lines. These are conductive, usually metallic, strips that provide an electrical contact on the front face of the triple junction cell. Embodiments of this invention are disclosed herein that reduce the optical losses caused by these gridlines, which are used in the majority of photovoltaic cells.

Figure 1:
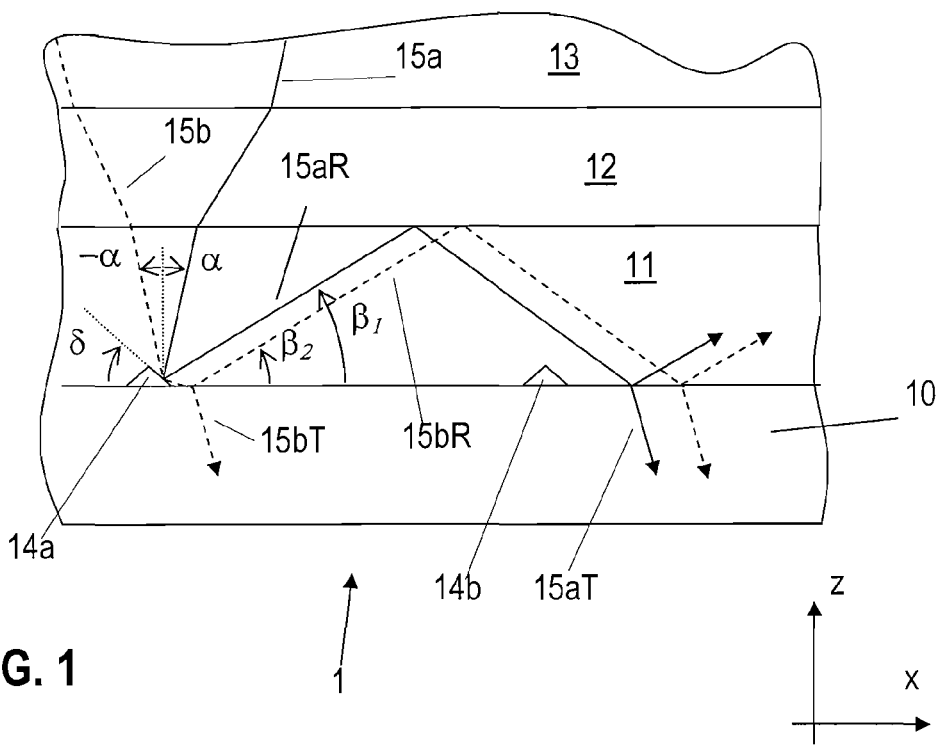
FIG. 1 is a schematic fragmentary cross-sectional view of part of a first form of photovoltaic device.

FIG. 1 shows a close-up view of a preferred embodiment, photovoltaic device 1, comprising photovoltaic cell 10, adjacent high-index layer, 11 with refractive index $n_{high}$, low-index layer 12 with lesser index $n_{low}$, and the body of secondary optical element (SOE) 13. Electrically conductive gridlines 14a & 14b are bonded to the top surface of photovoltaic cell 10 and project into layer 11. Their triangular cross section has base angle δ that the side subtends with the top surface of cell 10. The base angle δ is chosen so that bounding rays 15a and 15b of sun light incident on the grid lines within angles ±α are reflected laterally at angles β greater than the critical angle of Total Internal Reflection (TIR) within layer 11 by the interface with layer 12. Right ray 15a is reflected by gridline 14a into angle $β_1$, while left ray 15b is reflected by gridline 14a downward onto cell 10, thereupon being split into transmitted ray 15bt (which is absorbed within the cell) and Fresnel-reflected ray 15br going upward at angle $β_2$. Due to the generally high refractive index of solar cells (3 to 4), this Fresnel reflection is significant, even if the cell surface is AR coated.

Reflected rays 15aR and 15bR form respective angles $β_1$ and $β_2$ with the cell surface and they will reflect back towards the cell surface by TIR at the interface between layers 11 and 12 provided that:

$$\cos(β_1) > \frac{n_{low}}{n_{high}} \quad \cos(β_2) > \frac{n_{low}}{n_{high}}$$

At least some of that light can then be collected by the cell 10, as shown by exemplary ray 15aT.

Therefore, by the reflection law it is straightforward to calculate that:

$$β_1 = \left|\frac{\pi}{2} - 2δ + α\right| \quad β_2 = \left|\frac{\pi}{2} - 2δ - α\right|$$

The optimum choice of design angle δ depends on several considerations: the particular properties of the antireflective coating selected for the solar cell, the absorption coefficient of high-index dielectric material of transparent layer 11, the refractive indices $n_{high}$ and $n_{low}$, and any technological constraints of grid-line shape. Additionally, the cross-section of the grid lines affects more than the ray trajectories. Increasing the angle δ increases the cross-sectional area of the gridline, reducing the series resistance of the solar cell, and thus its electrical losses. For a particular set of values, standard formulae can be used by anyone skilled in the art to calculate the optimum value of δ.

A particular preferred embodiment has δ=π/4 (45°), because it gives the maximum half-acceptance angle α, and $β_1=β_2=α$, so that $$α = a\cos\left(\frac{n_{low}}{n_{high}}\right)$$

For instance, a phenyl-modified silicone such as Dow Corning JCR6175 and a fluoropolymer such as 3 M Dyneon can be used, which have respectively $n_{high}=1.54$ and $n_{low}=1.35$. Thus all rays with a inside the ±28.8° of rays 15a & 15b undergo TIR at the low index transparent layer 12. If higher incidence angles are produced by the CPV (concentrating photovoltaic) optics, some ray leakage will occur and the ray recovery will not be total.

The silicone and fluoropolymer layers 11 and 12 may be cast onto the photovoltaic cell 10. Alternatively, the two layers can be formed by sputtering of thick films. In order to prevent frustrated total internal reflection from occurring over the useful solar spectral wavelengths within the device, the thickness of these layers should be a minimum of 1 micron and preferably closer to 2 microns, well within the range of sputtering or other methods of thin film deposition.

Figure 2:
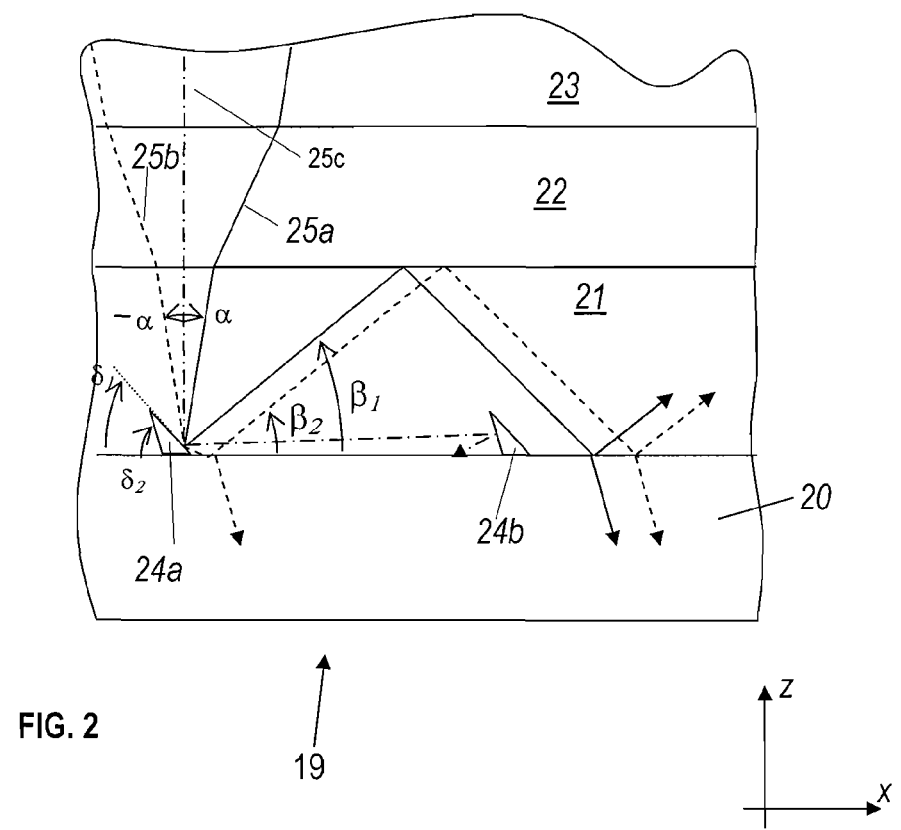
FIG. 2 is a view similar to FIG. 1 of a modified form of photovoltaic device.

The downward guided light in FIG. 1 may get lost if encountering another grid line 14b, and then reflected upwards at an angle too close to vertical for TIR, so that it will escape from the receiver. FIG. 2 shows photovoltaic device 19, comprising photovoltaic cell 20, high-index layer 21 disposed above it, low-index layer 22 next upward, and uppermost is the body of secondary optical element 23. Gridlines 24a and 24b have asymmetric triangles for cross sections, accordingly with non-complementary base angles $δ_1$ and $δ_2$. In FIG. 2 one of the angles at the base of the triangle is obtuse (i.e., the external angle $δ_2<90°$). Those rays 25c which are reflected nearly horizontally from the upward-facing side of one grid-line 24a and then hit the side of the next grid-line 24b will be reflected directly into the semiconductor material of cell 20. As shown in FIG. 2, rays 25a and 25b that reflect above or below the horizontal follow similar paths to rays 15a and 15b in FIG. 1.

Figure 3:
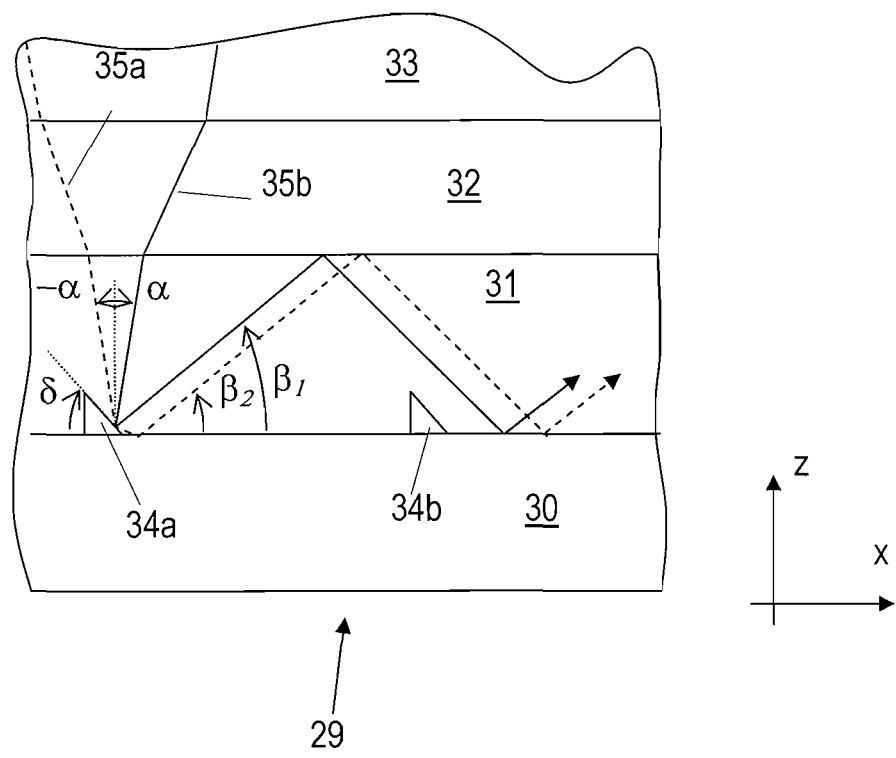
FIG. 3 is a view similar to FIG. 1 of a further modified form of photovoltaic device.

FIG. 3 shows similar preferred embodiment 29, comprising photovoltaic cell 30, high-index layer 31 disposed above it, low-index layer 32 next upward, and uppermost is the body of secondary optical element 33. Light enters in a cone between rays 35a and 35b at ±α, as in the previous embodiments. The triangle of grid-line 34a is right-angled ($δ_2=90$ deg), which is easier to manufacture. This way any light reflected off the angled wall of one grid-line 34a and hitting the vertical wall of the next grid-line 34b will stay guided (in the reversed direction, returning towards grid-line 34a). With this arrangement the loss manifested in FIG. 1 is halved, because only those rays that are still within the height of the grid-lines when they return to the first grid-line 34a are lost. The optical pathlength of the lost rays is doubled by the reflection at the vertical wall, so the angle within which rays are lost is effectively halved.

In FIG. 2, most rays between 25a and 25b are within the fan of angles from −α to +α, and will reflect off the face at base angle δ at angles below $β_1$, $β_2$ in the same way as in FIG. 1, except that those rays are all reflected to the same side. In FIG. 3, a few rays with incidence angles between −α and 0 are reflected off the vertical face of gridline 35a, and enter the cell 30 as if they had missed the gridline (in the reversed direction).

In order to evaluate the attainable gain by this embodiment, a full geometrical calculation must be done in three dimensions. The reflectivity of the grid-line metal, the cell AR coating's spectral response, materials absorption coefficients, and scattering both volume and surface are significant parameters. The interface surface between layers 11 and 12 of FIG. 1 and between layers 21 and 22 of FIG. 2 may preferably be made rough (in a controlled manner) in order to scatter the down-going light away from TIR specularity. That, for instance, can promote back-scattering on TIR so that part of the light rays can reach the surface of cell 10 or 20 sooner, with a smaller incidence angle on the cell AR coating (not shown) and a shorter path in the high index layer 11 or 21, respectively. Since scattering by roughness at a surface is much lower for refraction than for TIR, a useful scattering of the rays reflected by TIR can be obtained without the incoming rays being significantly scattered when refracted when entering layer 11 or 21. Limiting the scattering of incoming rays is of interest to obtain the correct direction change upon reflection by the triangular grid-lines.

Figure 4:
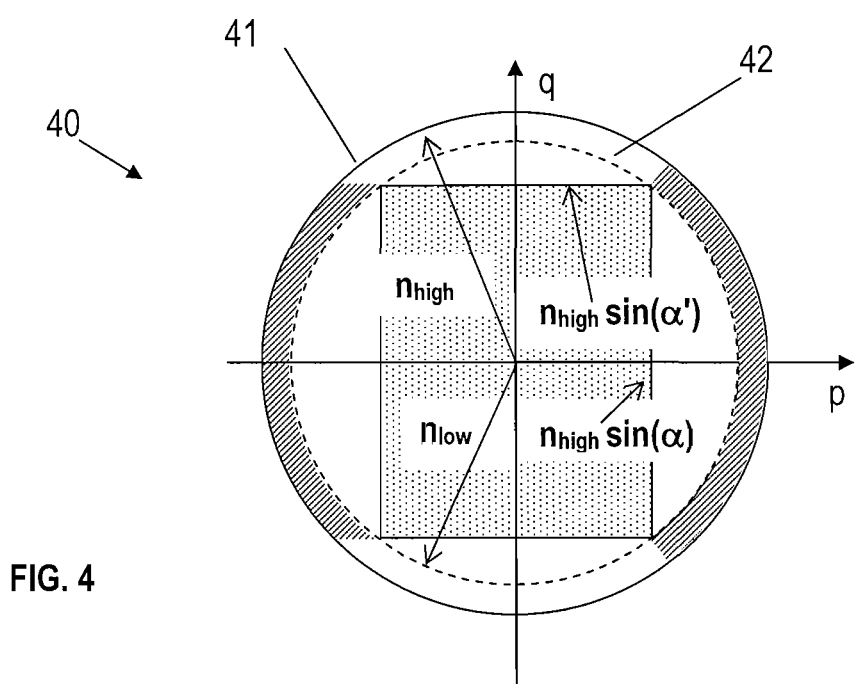
FIG. 4 is a plot of ray distributions in optical cosine p-q space.

Regarding the 3D geometrical calculations, FIG. 4 shows phase space diagram 40, where coordinate axes p and q are a ray's planar optical direction cosines, i.e. the unit direction vector of the ray is $$u = \frac{1}{n_{high}} \left( p, q, \pm\sqrt{n_{high}^2 - p^2 - q^2} \right)$$

Here the + and − sign apply to rays progressing upwards (away from the cell) and downwards (towards the cell), respectively. Any ray reaching or exiting the cell 10 of FIG. 1 is represented therefore as a point inside the circle 41, of radius $n_{high}$. Rays that can reach the cell after crossing the low index layer 12 of FIG. 1 (i.e., downward rays not suffering TIR on the interface between media 13 and 12) are represented by points inside the circle 42 of radius $n_{low}$. The abovementioned laterally guided rays of FIG. 1 lie within these two circles.

As can be easily checked, in the case $\delta=\pi/4$ previously mentioned for FIG. 1, the reflection on the right-hand half of a grid-line 14a produces the following transformation of the (p,q) coordinates:

$$p' = \sqrt{n_{high}^2 - p^2 - q^2}$$

$$q' = q$$

That is to say, q is unchanged, because the grid-line 14a is a cylinder with the y-axis as directrix, and the angle of the ray with the z-axis before the reflection equals the angle of the ray with the x-axis after the reflection.

As a consequence, the rays represented as points on the line $$|p| = n_{high} \sin(\alpha) = \sqrt{n_{high}^2 - n_{low}^2}$$

get transformed into rays on the circle of radius $n_{low}$ in FIG. 4 (i.e., just to the border of the TIR condition). It is straightforward to calculate that the point at which the circle and the lines cross is $$|q| = \sqrt{2n_{low}^2 - n_{high}^2}$$

This implies that a' in FIG. 4 is:

$$\alpha' = a\sin\left(\frac{2n_{low}^2}{n_{high}^2} - 1\right)$$

Thus α'=±32.5° for $n_{high}$=1.54 and $n_{low}$=1.35. This is especially interesting for concentrating photovoltaic (CPV) optics having a first element with rectangular entry aperture followed by a homogenizing square-section prism. The rays illuminating the cell then arrive with p-q values forming an approximately rectangular region that can be matched to the α-α' values, and thus geometrically all the grid-line reflections are recovered. A wider illumination angle can still be used, but then some rays hitting the gridlines will be lost. If a square illumination is required (because the entry is forced to be square or because grid-lines parallel to both x-axis and y-axis are used), the full-recovery of grid-line reflection is obtained by taking the lesser of α and α'.

If the dielectric SOE 13 is removed from the embodiment in FIG. 1, then the material of low-index layer 12 can be air, vacuum, or an inert gas (depending on the CPV module design) with refractive index close to 1. A solid dielectric layer 12, however, would provide protection of the TIR at the surface interfacing 11 and 12 since soiling will stay at the surface interfacing 12 and 13. Additionally, because 12 is composed of a low index material, the Fresnel reflection at the surface interfacing 12 and 13 will be low (below 1% for $n_{low}$=1.35). Additionally, the critical angle of the full layer structure will be higher, meaning that the acceptance angle α can be increased. In that case some of the rays will TIR at the interface between materials 12 and 13 while the remainder will TIR at the interface between materials 11 and 12.

Another option, which is simpler to manufacture, is making the material of SOE 13 coincide with that of low-index layer 12 (that is, a single layer is used), although in this case the TIR surface may not be protected. If the combined layer 12 and 13 is ambient air, the TIR surface is the exposed outer surface of the material 11. If the combined layer 12 and 13 is material of relatively high index, the TIR surface is the exposed outer surface of the combined layer 12 and 13, which in this embodiment is assumed to be flat and not too thick. Note that when the refractive index of SOE 13 is close to 1, or when there is TIR at an interface between SOE 13 and an environment with refractive index close to 1, the critical angle is much higher, and the criterion for TIR is easily fulfilled. In any of these cases case, an AR coating on the top surface (in contact with air) can be applied to keep the Fresnel reflection as low as possible.

The exact efficiency gain attainable in commercial devices using this approach will depend on the specific parameters of any particular cell. The limit is totally recovering all the light shaded by the gridline geometry, generally shading 8-12% of the cell surface in today's high concentration commercial triple-junction cells. Recovering the light reflected by the gridlines allows the gridlines to be placed closer, thereby reducing the cell's series resistance, without a corresponding current penalty. This therefore allows an increase in the geometric concentration and possibly also in the conversion efficiency due to the concentration increase.

Commercial high-efficiency triple-junction cells are a monolithic stack of three p-n junctions of different band gaps that are electrically connected in series (via tunnel junctions). The GaInP top junction has a high bandgap energy (around 1.8 eV) and thus absorbs light of short wavelengths (below 700 nm approx.) while being essentially transparent to the lower energy (longer wavelength) light. Longer wavelengths are absorbed by the Ga(In)As middle junction, as long as their energy surpasses the intermediate-layer's bandgap (around 1.4 eV, for a cut-off wavelength of 900 nm). The Ge bottom junction has a bandgap of 0.67 eV and thus absorbs wavelengths less than 1800 nm). The germanium layer is in fact the substrate wafer for the epitaxial growth.

Since the junctions are series connected, the smallest photocurrent capacity of the three junctions will limit the photocurrent of the solar cell. The photocurrents of the top and middle junctions of the commercial high-efficiency cells are designed to be fairly well balanced (within about ±5% at the usual solar spectra, such as the standard ASTM G173 AM1.5D). Such a match is provided by the selection of the bandgaps of the semiconductor materials and by the design of the antireflection coating atop the solar cell. The cell's encapsulant typically has a refractive index about 1.40-1.42, while the semiconductor has a much higher refractive index, over 3. The bandgap energy of the bottom Ge junction, however, is much smaller than is strictly required, which leads to an excessive photocurrent (by 40% to 50%) over those of the top and middle junctions. Therefore, we could say that in present commercial high-efficiency cells it is approximately true that:

$$I_{SC,3J} = I_{SC,TOP} \approx I_{SC,MIDDLE} \approx \frac{2}{3} I_{SC,BOTTOM}$$

Here $I_{SC,3J}$ denotes the short circuit current of the triple junction cell.

Figure 5:
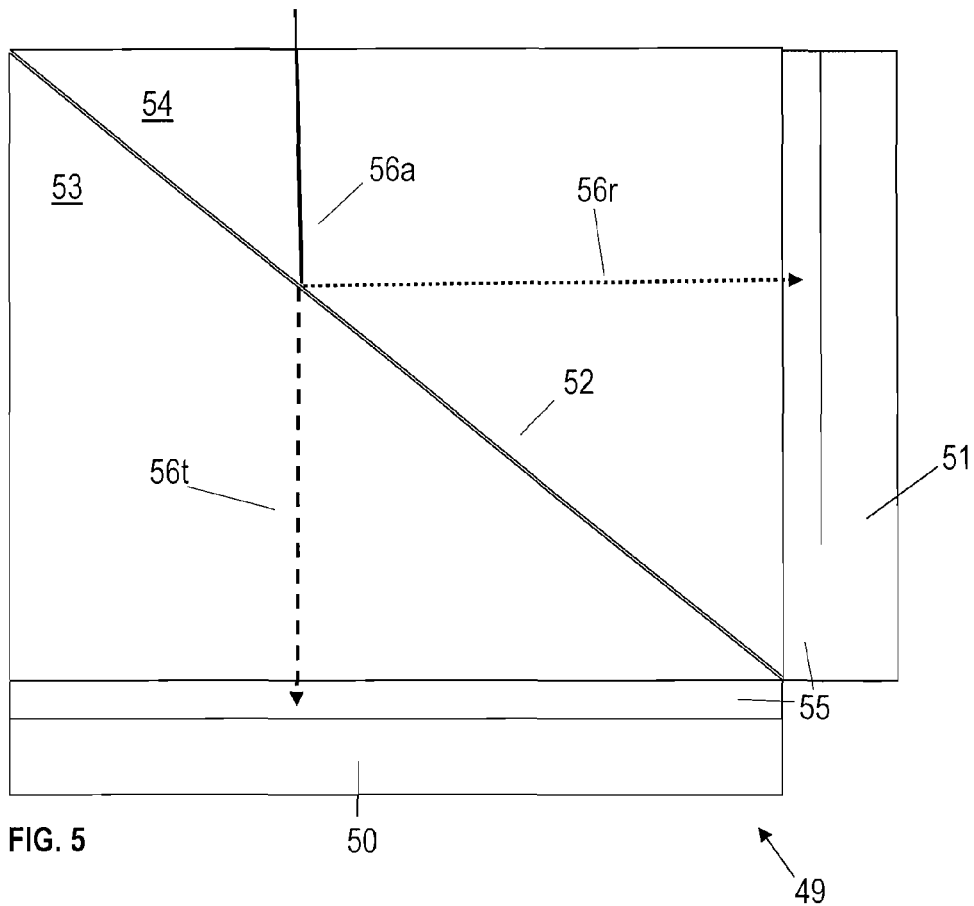
FIG. 5 is a schematic cross-sectional view of a second form of photovoltaic device.

FIG. 5 shows a conceptual embodiment in which it is possible to take advantage of the excess current of the germanium bottom junction. This device 49 comprises a monolithic triple-junction primary cell 50, a separate exterior or secondary cell 51 arranged at right angles to the primary cell 50, and a block-band dichroic filter 52 positioned diagonally between the cells 50 and 51, on the diagonal surface of either of two prisms, lower prism 53 or upper prism 54, that fill the space between the cells 50 and 51. The prisms are optically coupled to the cells by low-index layers 55. Incident light 56*a* is distributed between the two cells, shorter wavelengths being transmitted to cell 50 and longer wavelengths reflected to cell 51. The four junctions of the two cells 50 and 51 are series connected as a two-terminal device. Such a secondary cell 51 can, for instance, be a high-efficiency silicon cell (Si bandgap energy about 1.12 eV, for cut-off wavelength of 1,100 nm) capable of operating under concentrated light, such as the back-point-contacted cell, which has achieved efficiencies over 27% at 100 suns. If desired, 4-terminal operation can be used, and the current matching constraint for the secondary cell is then eliminated. In that case the efficiency in operation (including the spectral variation of sun irradiation) can be higher at the expense of double wiring in the CPV module.

The block-band filter 52 can reflect light 56*r* with a wavelength between 900 and 1,100 nm, thus reducing the flux of transmitted light 56*t*, and therefore the excess photocurrent, reaching the Ge bottom junction of cell 50, while not affecting the top and middle junctions. The reflected light can be used effectively by the silicon cell 51.

The silicon cell 51 and the multijunction cell 50 can be exchanged if the block-band dichroic filter 52 is replaced by the complementary band-pass filter. In the rest of the document we will refer to the filter as band-pass filter, or as a block-band or stop band filter, it being obvious for those skilled in the art which type applies for each configuration.

The device 49 shown in FIG. 5 is also the subject of the calculations done before for the device in FIG. 1, since the guidance conditions inside media of prisms 53 & 54 of the light reflected by the filter do not differ conceptually from those of the tilted sides of gridlines 14.

Assuming at first no absorption in the optical elements, so that optical power is conserved, the spectrum splitting may cause the cell currents to change, but must fulfill the constraint that:

$$I_{SC,TOP} + I_{SC,MIDDLE} + I_{SC,BOTTOM} + I_{SC,EXT} = \text{constant}$$

Taking into account that $$I_{SC,3J} = I_{SC,TOP} \approx I_{SC,MIDDLE} \approx \frac{2}{3} I_{SC,BOTTOM}$$

For the case with no secondary cell 51, it is easily deduced that the constant equals $(7/2)I_{SC,3J}$, and the short circuit current of the combination of the triple-junction and exterior cell in series connection is:

$$I_{SC,4J} = \min\{I_{SC,TOP}, I_{SC,MIDDLE}, I_{SC,BOTTOM}, I_{SC,EXT}\}$$

Here $I_{SC,EXT}$ is the short circuit current of the secondary silicon cell 51 (i.e., separate from monolithic triple-junction cell 50). The design problem is then maximizing $I_{SC,4J}$ subject to the above-mentioned constraint $$I_{SC,TOP} + I_{SC,MIDDLE} + I_{SC,BOTTOM} + I_{SC,EXT} = \text{constant}$$

Figure 6:
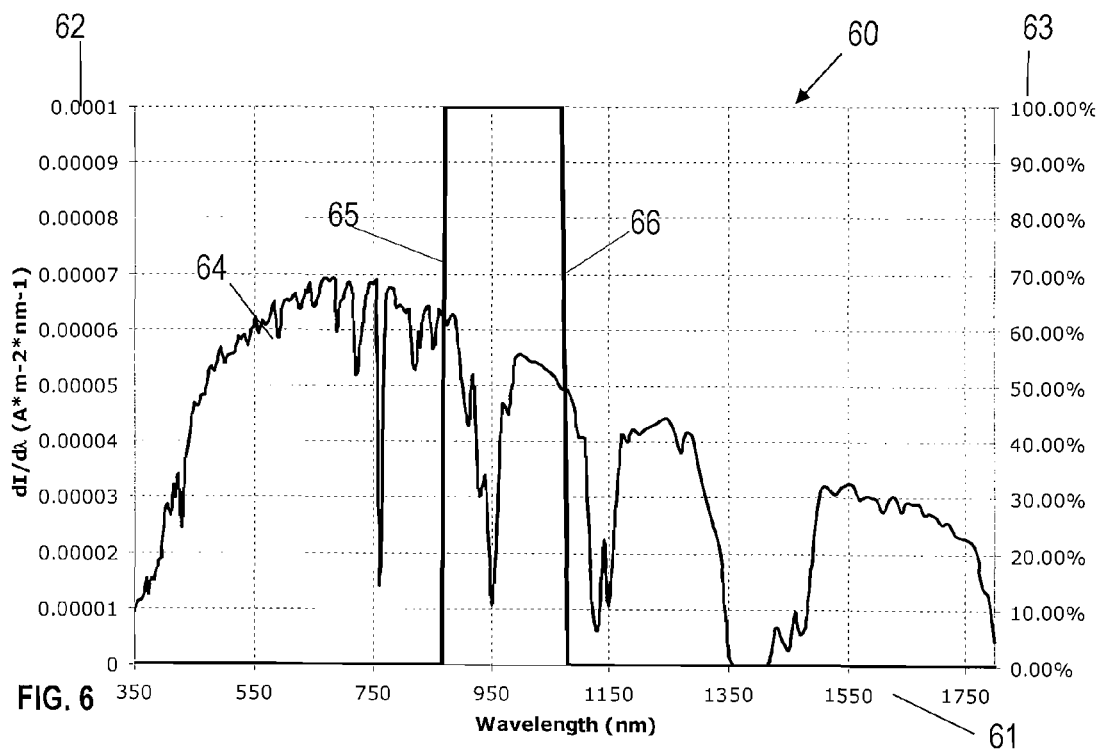
FIG. 6 is a graph showing the spectral characteristics of a bandpass filter and a 3-junction photovoltaic cell.

FIG. 6 shows graph 60 with abscissa 61 of wavelength in nm, left ordinate 62 for solar flux curve 64, and right ordinate 63 for percentage reflectance. The spectrum of a block-band or band pass filter designed for filter 52 of FIG. 5 has short-wave cutoff 65 and long-wave cutoff 66, reflecting light in the 900-1,100 nm range into silicon cell 51. This spectral filtering does not disturb the top and middle cell currents, which rely on wavelengths below 900 nm, but the wavelengths above 890-900 nm have insufficient photons to make the Ge and Si cells produce photocurrents close to those of the top and middle cells, so for series connection they will not be well matched. The optimum design case for this situation (of unchanged top and middle photocurrents) occurs when the longer-wavelength cutoff of the filter equalizes the Si and Ge photocurrents:

$$I_{SC,4J} = I_{SC,BOTTOM} \approx I_{SC,EXT} \approx \frac{3}{4} I_{SC,TOP} \approx \frac{3}{4} I_{SC,MIDDLE} \approx \frac{3}{4} I_{SC,3J}$$

Here $I_{SC,4J}$ denotes again the short circuit current from a triple-junction cell operating without a spectrum splitter.

Although the cutoffs 65 and 66 are shown with no transition slope, that is not possible with present technology. Also, the transition wavelengths for the cutoffs will change as a function of the incidence angle on the filter: the lower the incidence angle, the shorter the transition wavelength. Consequently, if the incoming light is not perfectly collimated, the cutoffs will effectively be less sharp than their nominal slope would indicate. Also, as the angle of the incidence gets close to the Brewster angle, the p-polarization component of the light becomes more and more difficult to reflect. However, even though present filters have limitations, there is still sufficient control to achieve a significant boost in efficiency, even when the filter incidence angle is a nominal 45°. In particular, when, as is discussed below, light in a given waveband is shared between the transmitted and reflected beams, a sharp cliff cutoff is not necessary, though it makes filter design easier. The control of the transition cliffs of filters, as well as their slope, is improved as the angle of incidence goes towards zero, and as the beam angle of the cone of rays impinging on the filter becomes narrower. Several preferred embodiments are revealed herein that operate with filter incidence angles of 0 to 35°, with one operating in the 20 to 30° range. In addition, several novel filter designs are disclosed that are mass producible.

The highest efficiency silicon cells work under concentrated light and are back-point-contact cells, with efficiencies over 27% at 10 W/cm$^2$, open circuit voltages at 25° C. of 0.810 mV, and fill factors over 0.82 (A. Slade and V. Garboushian, "27.6% Efficient Silicon Concentrator Solar Cells for Mass Production", PVSEC 15, October 2005, Shanghai, China). Since the open circuit voltage of the multijunction cells is typically around 3.1 V at 40-50 W/cm$^2$ and 25° C., the open circuit voltage of the 4-junction series set would be about 25% higher than that of the unfiltered triple-junction cell ((3.1+0.81)/3.1≈1.25V). Assuming the fill factor of the four junctions in series is the same as that of the triple junction, these calculations suggest that the addition of the cell fourth cell in series will unfortunately result in a lower efficiency than the triple-junction cell working alone (since 1.25*3/4<1). Therefore this scheme is not practical in and of itself (unless four terminal operation is chosen).

The filter, however, can be designed to reduce the photocurrent of the middle junction of the multijunction cell, via the appropriate selection of the short wavelength cut-off limit 65 of the filter. Combining this added degree of freedom with the adequate selection of the long wavelength cut-off limit 66 of the filter, the match of the middle, bottom and exterior photocurrents is achieved (which again would be optimum for the series connection). FIG. 6 shows in a simplified example of bandpass filter, indicating the two degrees of freedom considered: the short and long wavelength cut-off limits 65 and 66, respectively. Thus the previous example becomes:

$$I_{SC,4J} = I_{SC,MIDDLE} \approx I_{SC,BOTTOM} \approx I_{SC,EXT} \approx \frac{5}{6}I_{SC,TOP} = \frac{5}{6}I_{SC,3J}$$

Since 1.25*5/6≈1.04, then a 4% improvement of conversion efficiency could in principle be obtained relative to the three junction cell alone. This improvement alone, if achieved, would probably not compensate for the added complexity. Now, however, the top current is the one oversized (by 20%, since 6/5=1.2), and this of practical interest, because diurnal spectral variations are mainly in the amount of blue light removed from the direct beam by Rayleigh scattering at different solar elevations. These variations mainly affect the top cell, and thus the spectral sensitivity of the efficiency of such a device would be much smaller than that of the triple junction alone.

Figure 7:
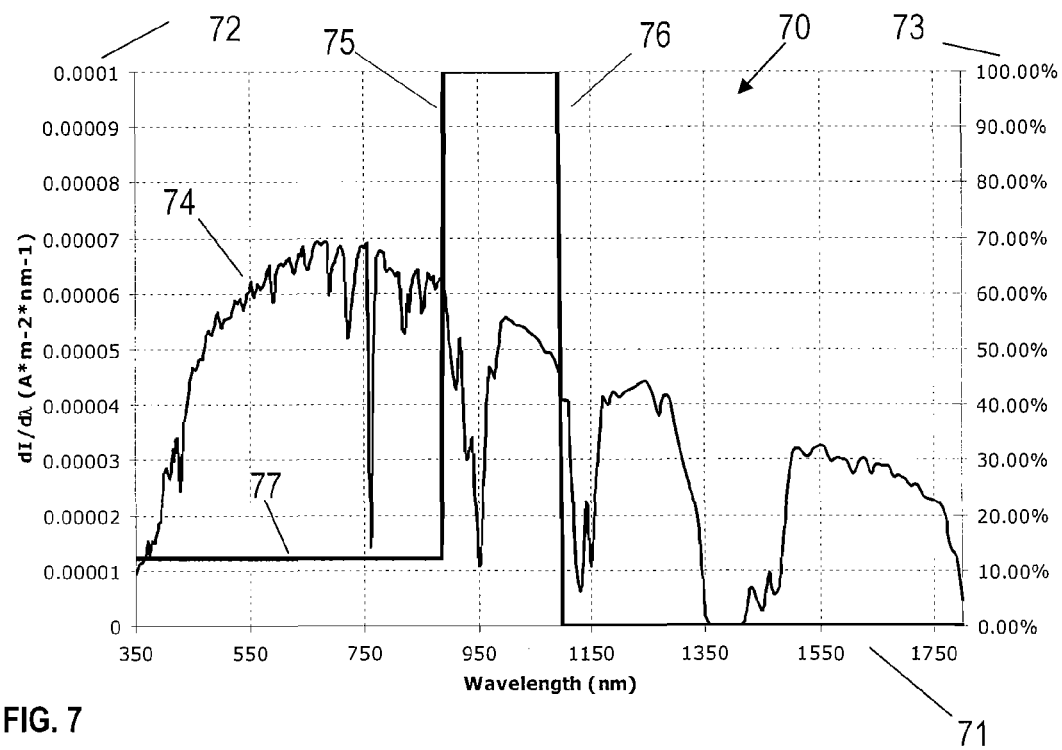
FIG. 7 is a graph similar to FIG. 3B for a different bandpass filter.

A higher efficiency is possible if the filter has the spectrum shown in graph 70 of FIG. 7, which has wavelength abscissa 71, left ordinate 72 for solar flux curve 74, and right ordinate 73 in percentage reflectance of the filter. The difference from the spectrum of FIG. 6 is the non-zero reflectance portion 77 to the silicon cell at the short wavelengths, those that excite the top and middle cells. This additional degree of freedom of the height of (together with adjustment of the band cut-offs 75 and 76) enables the four currents to equalize, so we obtain (where $I_{SC,3J}$ has the same meaning as before):

$$I_{SC,4J} = I_{SC,MIDDLE} \approx I_{SC,BOTTOM} \approx I_{SC,EXT} \approx I_{SC,TOP} = \frac{7}{8}I_{SC,3J}$$

In this case, assuming a voltage increase of 25% as calculated above, the efficiency gain could be about 9% (1.25*7/8=1.09).

The filter designs shown in FIGS. 6 and 7 are only illustrative, and other filter spectra are possible that get the same results, as is obvious to those of skill in the art. For instance, the slopes of the cut-offs do not need to be so abrupt, nor does the filter reflectivity 77 in the visible range need to be flat, provided that the integrated values are maintained to provide the current balance. This fact has practical importance, since modest cutoff slope reduces both the cost of the filter and its sensitivity to layer variations. In fact, as was previously mentioned, it is even believed that it is not possible (with known materials) to design filters with such vertical transmission steps in a tilted configuration for non-collimated light (which is the case in most of the embodiments described herein).

Figure 8:
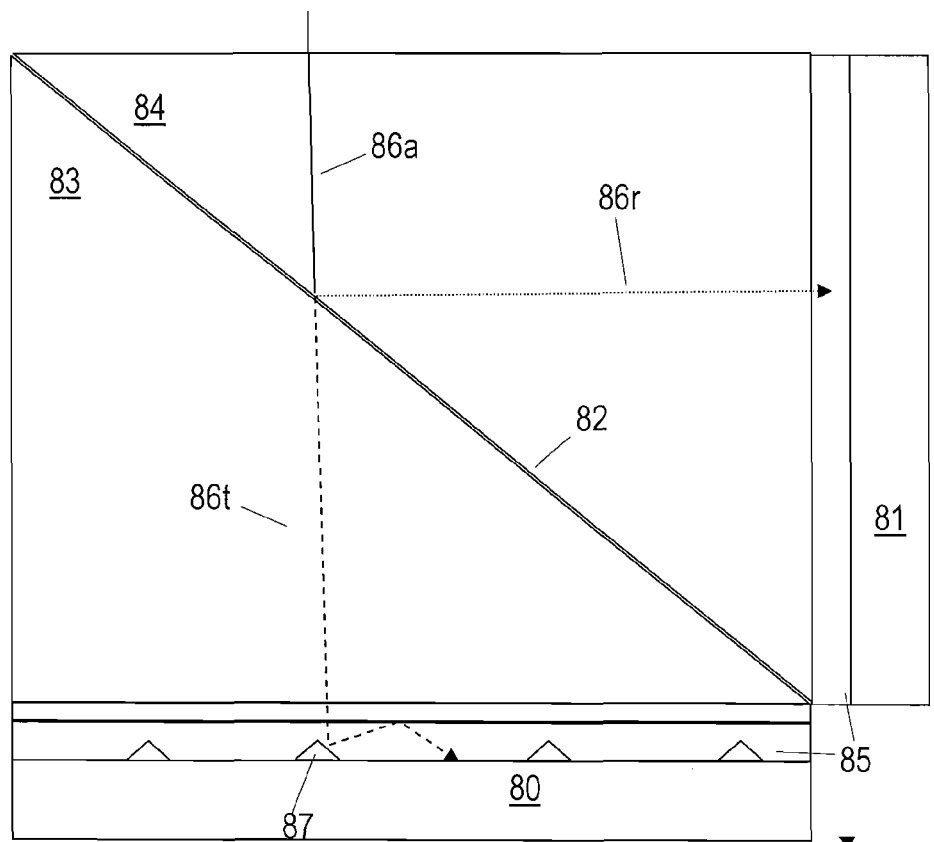
FIG. 8 is a view similar to FIG. 5 of a different form of photovoltaic device.

The filter approaches just described can be used with any triple-junction cell, no matter the grid line geometry. FIG. 8 shows device 79 comprising triple junction cell 80, secondary cell 81, and diagonal filter 82 on either lower prism 83 or upper prism 84 that splits incoming light rays 86a into reflected rays 86r and transmitted rays 86t. Grid lines 87 are deliberately shaped as shown in FIG. 1, and a low-index layer 85 is inserted between cell 80 and prism 83 to provide TIR guidance of light rays reflected from the triangular gridlines 87. (The size of triangular gridlines 87 is exaggerated in FIG. 8 for clarity.) When the filtering just described is combined with the grid line and TIR approach of FIG. 1, the two efficiency gains are combined into a nearly 18% increase (1.08*1.09=1.177), in this simplified model.

Figure 9:
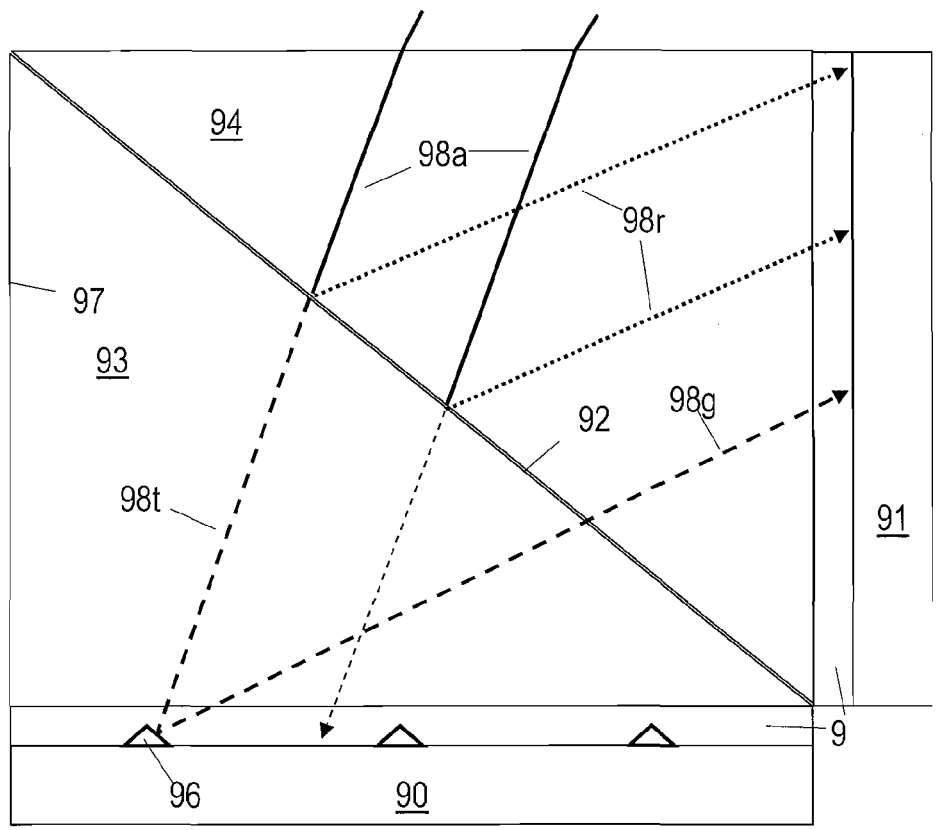
FIG. 9 is a view similar to FIG. 5 of another form of photovoltaic device.

FIG. 9 shows another embodiment. Device 89 comprises triple junction cell 90, secondary cell 91, and spectrum splitting filter 92, conceptually similar to that of FIG. 6, on the diagonal face of either lower prism 93 or upper prism 94. An encapsulant layer 95 couples each cell to its respective prism. External silicon cell 91 is to be used with the triple-junction cell 92 as a two-terminal device, with the four junctions connected in series. The block-band filter 92 is designed to split the incident light 98a, and reflect the light 98r in the spectral range for which the silicon cell is sensitive, all without disturbing the top and middle cell currents. In contrast to the case of FIG. 8, no light guiding is used to confine the light reflected by the grid-lines 96, so encapsulant 95 can be index matched to the prism 93. A fraction 98g of the transmitted light 98t (which will lack those wavelengths 98r reflected laterally by the diagonal filter 92) impinges on grid-lines 96. The cross section of the grid-lines is appropriately shaped to reflect that light 98g onto cell 91. The filter 92 is transparent to the wavelengths of the light 98t & 98g, the latter being reflected off gridline 96 and then transmitted through filter 92 towards the external cell 91, contributing to its increased photocurrent.

If gridlines 98 have symmetrical triangular cross-sections (as shown in FIG. 9), a reflector may be provided on lateral surface 97, at the side of prism 93 opposite the silicon cell 91, to recover light reflected off the left sides of the gridlines 96. That reflector can be dispensed with if the nonsymmetrical grid-lines of FIG. 2 or FIG. 3 are used instead.

For a given grid line spacing, both the cut-off wavelengths of the filter can be adjusted to match the three photocurrents in a fashion similar to the case of FIGS. 5 and 6. The estimation formula is:

$$I_{SC,4J} = I_{SC,MIDDLE} \approx I_{SC,BOTTOM} \approx I_{SC,EXT} \approx \frac{5}{6} I_{SC,TOP} = \frac{5}{6} I_{SC,3J}$$

That formula also applies to this case, but note that the original photocurrent $I_{SC,3J}$ of the triple-junction cell is higher (particularly if the facet angle shown in FIG. 9 is high) than that of the same cell with gridlines of arbitrary cross section.

If the grid spacing is properly selected as an additional design parameter, together with the edge cutoffs 65 and 66 of FIG. 6, the 4 photocurrents can again be matched. Note that such a match is not equivalent to that produced by the filter in FIG. 7, since that filter does not reflect any light in the 1,100 to 1,800 nm range, while the grid line reflection does reflect some of that light, because it is not spectrally selective.

Figure 10:
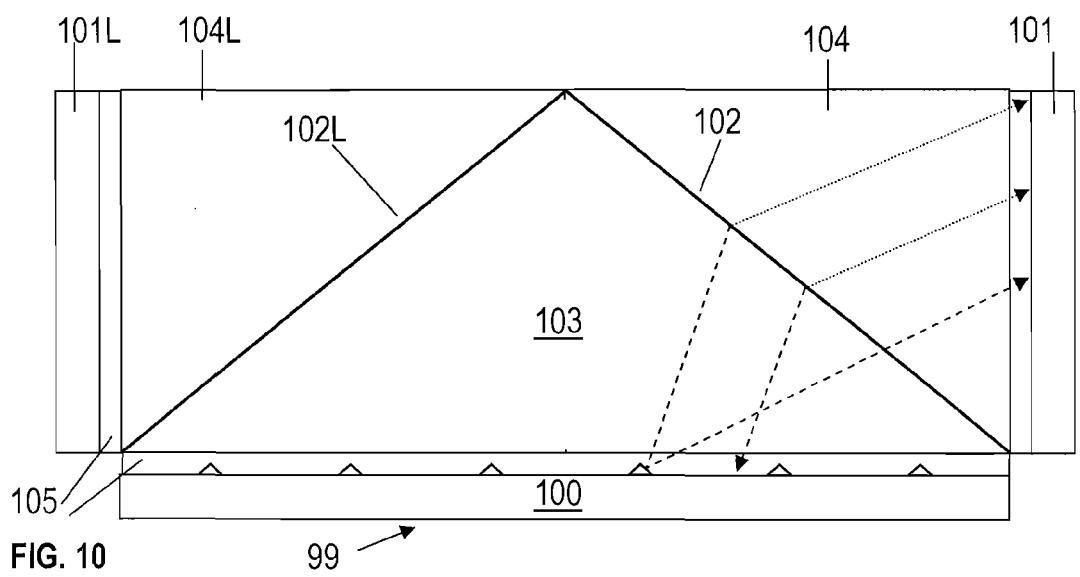
FIG. 10 is a schematic cross-sectional view of a further form of photovoltaic device.

Instead of using the reflector 97 in FIG. 9, its plane can be made into a centerline of a wider device, namely 99 of FIG. 10, comprising triple-junction cell 100, left secondary cell 101L, right secondary cell 101R, left diagonal filter 102L, right diagonal filter 102R, lower isosceles prism 103, lateral right-triangle prisms 102L and 102R, and encapsulant layers 105. This duplicated scheme has two block-band mirrors tilted in opposite directions for the filters, reflecting to the two exterior cells 101L and 101R. The arrangement of FIG. 10 is most effective when the incident light shines vertically from the top of FIG. 10, where the arrangement of FIG. 9 may be preferred when the incident light is off axis, as shown by the rays 98a.

Figure 11:
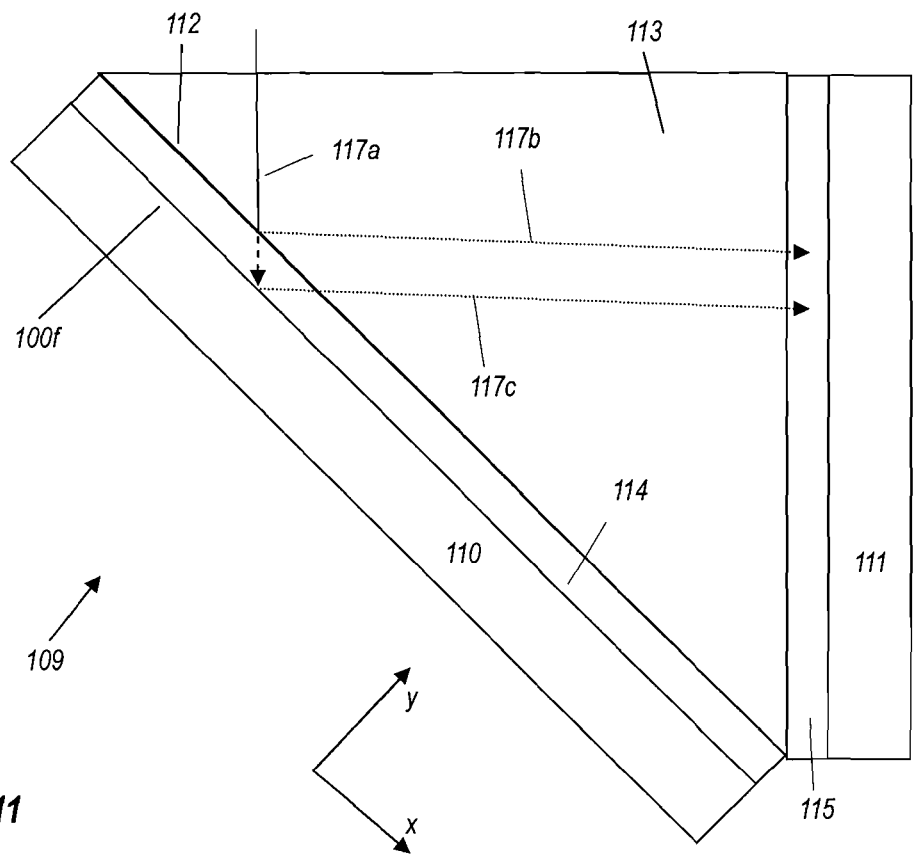
FIG. 11 is a schematic cross-sectional view of a further form of photovoltaic device.
Figure 12:
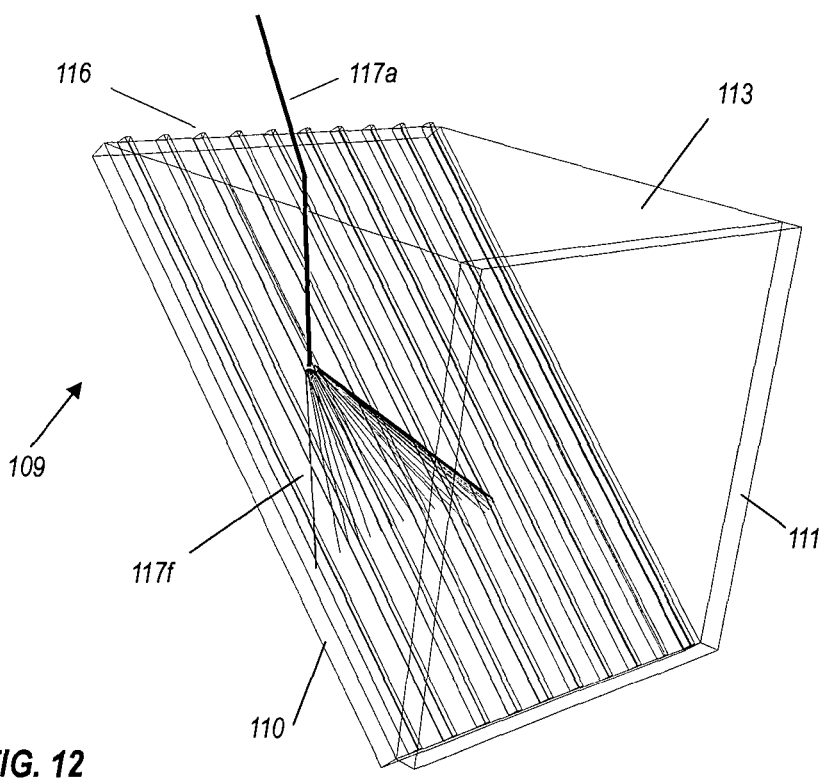
FIG. 12 is a perspective view of the device shown in FIG. 6A.

FIGS. 11 and 12 show preferred embodiment 109, which comprises a right-angle prism 113 with triple-junction cell 110 facing its hypotenuse and an external photovoltaic cell 111, preferably silicon on one short face. A spectrum-splitting filter is coated either on diagonal face 112 of right triangular prism 113 or on front surface 110s of cell 100, as a part of its antireflection coating. The prism 113 is optically connected to the cells by encapsulant layers 114 and 115. The multijunction cell 100 is tilted with respect to the average direction of the sun radiation 106a (which is supposed to be perpendicular onto the top face of prism 113 in FIG. 11) and the surface of multijunction cell 100 specularly reflects the considerable Fresnel component at this tilt angle. Both light 117r reflected from the filter (if located on face 112) and light 117f Fresnel-reflected from the semiconductor surface will reach the external cell 111. This light that is Fresnel-reflected off the semiconductor surface was lost in the previously disclosed embodiments, so this configuration allows further improvements in conversion efficiency.

In this case, the grid lines of the multijunction cell (not shown in FIG. 11) are preferably aligned parallel to the x axis shown in FIG. 11, parallel to the plane of FIG. 11 and perpendicular to the length of prism 113. This is because, due to its linear symmetry, no matter what the cross sectional shape, the conservation of the rays' linear momentum will keep them guided inside prism 113 so they reach cell 101. FIG. 12 is a perspective view of the same photovoltaic device 109, showing triple junction cell 110 with gridlines 116 and external cell 111. Incoming rays 117 are refractively deflected when they enter prism 113, and then are reflected off gridline 116 to become ray fan 117g. Because the grid-lines 116 are of constant cross-section along their length, in the x direction, reflection off the grid-lines 116 does not alter the x-component of the direction vector. Therefore, all the rays in the fan 117g form a cone with its axis along the direction of grid-line 116. The crown of the cone 117g is along the ray 117f shown in FIG. 11, so all other rays enter secondary silicon cell 111 below the ray 117f and slanting above or below the plane of the drawing as seen in FIG. 11. For maximum efficiency, rays striking the end walls of prism 113 are reflected back into the prism either by TIR or by a reflective coating, depending on the refractive index. Thus, even if the gridlines 116 are not specially angled, the relative positioning of the cells 110 and 111 and the angling of the gridlines 116 as shown in FIG. 12, both in elevation within the x-y plane and in azimuth about the y axis, makes possible reuse of the reflected rays 117g.

Figure 45:
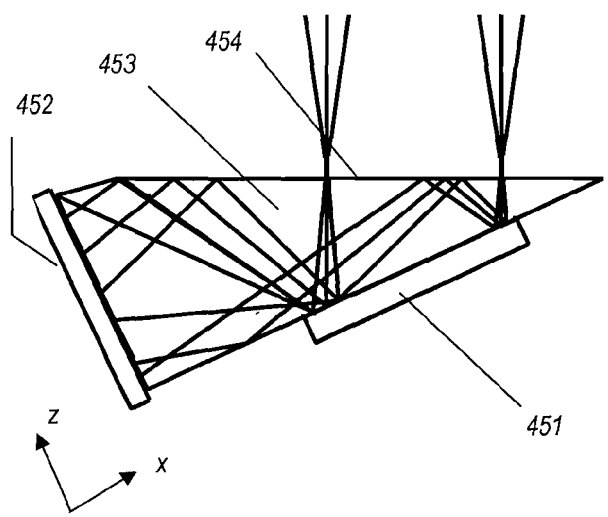
FIG. 45 is a side view of another form of photovoltaic device.
Figure 46:
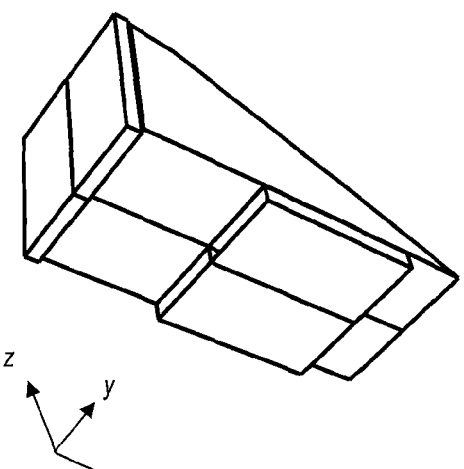
FIG. 46 is a perspective view of part of the device shown in FIG. 44.

FIGS. 45 and 46 show an alternative configuration to FIG. 11. Photovoltaic device 450 comprises two identical modules with triple-junction cells 451, secondary cells 452, and right-angle prisms 453. Here the filter is placed on the surface of the triple junction cell 451, and the light reflected by the filter will hit front surface 454 of the prism 453 and be total internally reflected on surface 454 towards the secondary cell 452. The light reflected by the gridlines (preferably aligned parallel to the x axis) will also be directed towards the secondary cell 452 or to the surface 454 and will also undergo TIR. In case a solid dielectric secondary optical element is to be coupled to the device 450, the refractive index of the prism must be higher that that of the coupler to guarantee TIR by surface 454. For example, if the SOE and the prism 453 have similar refractive indices, a coupling layer of low-index material, or even an air gap, may be used. Similarly, an SOE may be attached to the top, intake surface of prism 113 in FIG. 11. In FIG. 11, little light is reflected by TIR at the top surface of prism 113, so maintaining the TIR may be less important but is still desirable for maximum efficiency.

Figure 13:
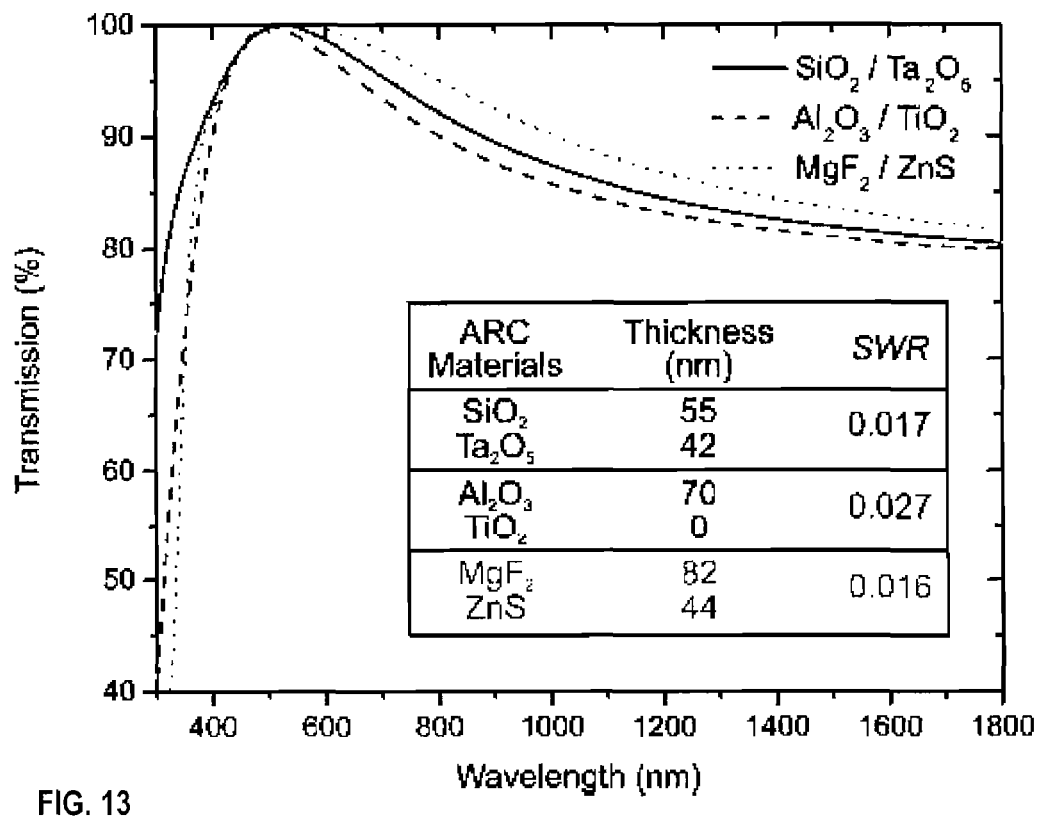
FIG. 13 is a graph of the spectral transmission characteristics of anti-reflection coatings (ARC) of different materials.

FIG. 13 shows the spectral transmittance of some suitable materials for the Anti-Reflection Coatings (ARC).

Still further gains can be obtained in the configuration of FIG. 11 by placing another filter on the surface interfacing prism 113 and the encapsulant 115 of the silicon cell 111 in order to reflect back to the triple junction cell the light with wavelengths above the 1100 nm bandgap energy limit of silicon, that is, the light to which silicon is not sensitive but germanium is. Adjusting the design parameters, the four junctions can be matched and the condition $I_{SC,4J} \approx I_{SC,3J}$ can be attained in principle, which implies about 25% conversion efficiency gain.

Summarizing: the design condition for the optimum cases just described is that the filter or filters and the grid line pitch are designed to make the photocurrents of the middle, bottom and the exterior junctions equal, while the top junction current is equal to the others (or slightly greater than the others to allow tolerance for variations in the short-wavelength content of the incoming light).

Figure 14:
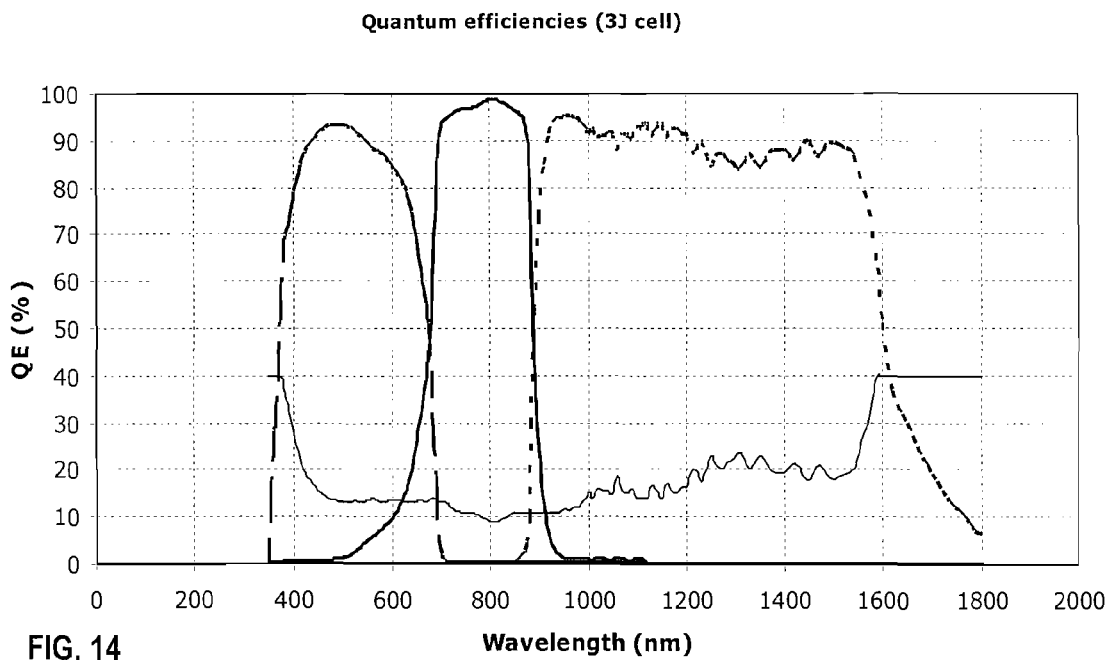
FIG. 14 is a graph showing as a function of frequency the quantum efficiencies of the three junctions and the reflectivity of a multi junction cell.
Figure 15:
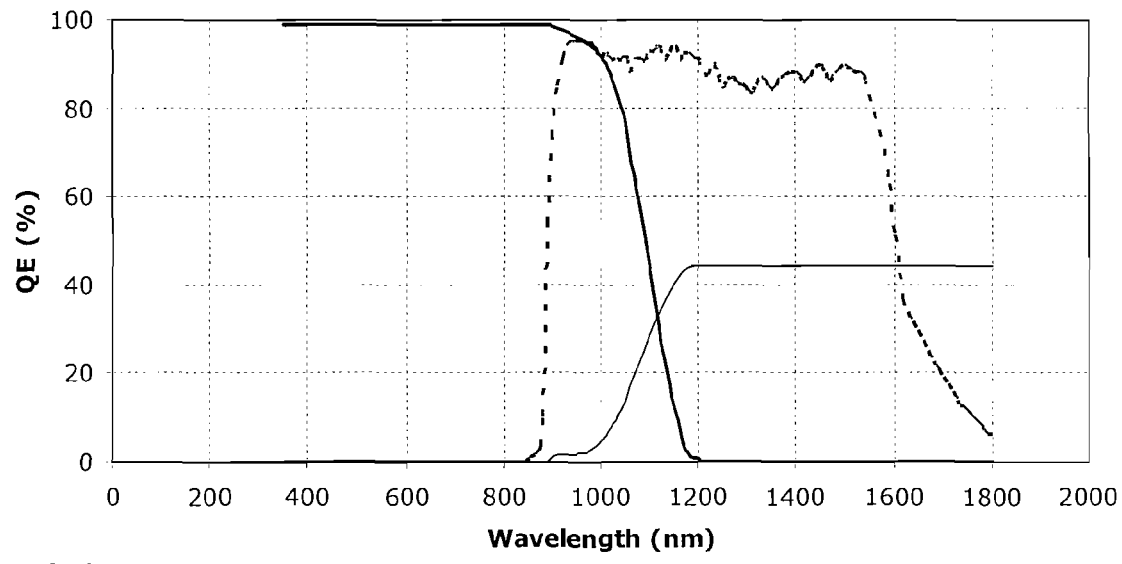
FIG. 15 is a graph similar to FIG. 14 for a silicon cell, with the bottom junction curve of FIG. 14 included.

In order to more precisely quantify these gains, a more detailed analysis takes into account the published external quantum efficiency data of high efficiency commercial cells. FIGS. 14 and 15 graph the spectral dependence of the external quantum efficiencies (EQE) of the triple-junction cell and silicon cell, respectively, quoted from the manufacturers' literature. Also, the cell reflectivities are shown, indicating that the AR coating on the triple junction cell is optimized to maximize and balance the top and middle junction photocurrents, while sacrificing excess bottom cell photocurrent. The EQE of the silicon cell is close to one because in the selected case, the contacts are all on the back side (i.e., no grid line losses occur) and the infrared reflectivity of the textured silicon cell is due to its transparency for wavelengths above 1100-1200 nm.

In Table 1, the irradiance at the entry of the PV device is 50 W/cm². The optimized design parameters, photocurrent resulting values and estimated conversion efficiencies are listed in the following tables. Note the high efficiencies in the rightmost column of Table 1, relative to the 40% efficiency of a triple junction cell alone.

TABLE 1

| Case | FIG | $I_{SC,TOP}$ (A) | $I_{SC,MID}$ (A) | $I_{SC,BOT}$ (A) | $I_{SC,EXT}$ (A) | $I_{SC,2\,term}$ (A) | Fraction (%) | Limiting cell/cells | Conversion efficiency |
|---|---|---|---|---|---|---|---|---|---|
| 1 | None | 6.95 | 7.22 | 10.48 | — | 6.95 | 100% | T, M | 40.0% |
| 2 | 1 | 7.56 | 7.84 | 11.39 | — | 7.56 | 109% | T, M | 43.5% |
| 3 | 5 & 6 | 6.94 | 6.08 | 5.94 | 5.9I | 5.91 | 85% | M, B, E | 42.9% |
| 4 | 5 & 7 | 6.28 | 6.27 | 6.30 | 6.28 | 6.27 | 90% | T, M, B, E | 45.5% |
| 5 | 6 & 9 | 6.9I | 6.37 | 6.40 | 6.39 | 6.37 | 92% | M, B, E | 46.2% |
| 6 | 6 & 9 | 6.45 | 6.45 | 6.47 | 6.44 | 6.44 | 93% | T, M, B, E | 46.7% |
| 7 | 7 & 8 | 6.63 | 6.63 | 6.57 | 6.59 | 6.57 | 94% | T, M, B, E | 47.7% |
| 8 | 6 & 11 | 6.70 | 6.70 | 6.72 | 6.67 | 6.67 | 96% | T, M, B, E | 48.4% |
| 9 | 6 & 11 | 6.94 | 6.93 | 6.92 | 6.93 | 6.92 | 100% | T, M, B, E | 50.2% |

TABLE 2

| Case | Grid line shaping required? | Illumination on cell angularly decentered ("tilted cell")? | Number of junctions |
|---|---|---|---|
| 1 | No | No | 3 |
| 2 | Yes | No | 3 |
| 3 | No | No | 4 |
| 4 | No | No | 4 |
| 5 | Yes | No | 4 |
| 6 | Yes | No | 4 |
| 7 | Yes | No | 4 |
| 8 | No | Yes | 4 |
| 9 | No | Yes | 4 |

TABLE 3

| Case | Filter short cut-off (nm) | Filter long cut-off (nm) | Ge spectral range recycling | Filter reflectivity below low cut-off | Grid density |
|---|---|---|---|---|---|
| 1 | — | — | no | 0.0% | 8.0% |
| 3 | 860 | 1130 | no | 0.0% | 8.0% |
| 4 | 890 | 1100 | no | 9.5% | 8.0% |
| 5 | 870 | 1070 | no | 0.0% | 8.2% |
| 6 | 890 | 1050 | no | 0.0% | 15.0% |
| 7 | 890 | 1090 | no | 12.1% | 8.0% |
| 8 | 890 | 1050 | no | 0.0% | 11.0% |
| 9 | 890 | 1110 | yes | 0.0% | 8.0% |

Case 1 is the baseline case of the triple junction cell alone. It has the typical slight mismatch between the top and middle junctions. Its efficiency of 40% at 50 W/cm² is a round number conveniently close to the current world record cell (41.6% at 24 W/cm², by Spectrolab).

As shown in these tables, the maximum estimated efficiency gain is about 1.25, making it possible to get close to, or even surpass, the 50% conversion efficiency barrier, by using a 40% triple junction cell and a 27% efficient silicon cell.

The silicon cell and the triple junction cell, operating separately, have respectively $I_{SC,3J}$=14.9 mA/cm² and $I_{SC,EXT}$=41.5 mA/cm² at one sun, and the ratio of $I_{SC,EXT}/I_{SC,3J}$=41.5/14.9=2.8. Since in all embodiments $I_{SC,4J}$ is close to $I_{SC,3J}$, the silicon cell in operation shows an equivalent concentration of 2.8 times that of the 3J cell, which adequately matches the ratio of the short circuit levels at which both type of cells have proven their maximum efficiencies at today.

The silicon cell, which is more sensitive to operating temperature, has a low thermal load in these preferred embodiments, since the heat generation mainly occurs at the 3J cell.

The devices described above show and explain certain concepts, but they lack certain aspects of practical utility for implementation as a product. The following embodiments address such issues.

More practical versions of the devices involve the following objectives:

The two cells reside on the same plane (to share the same heat-spreading substrate and simplify assembly and interconnections)

The two cells can be placed apart with a sizable gap between them without serious optical losses in the gap.

In some configurations it may be important for the incoming light to be centered on the normal to the plane of the cells, at least approximately. This is not attained in the previous embodiments having tilted cells. Such a tilt, however, is typical of CPV off-axis reflective optics.

These objectives can be attained to a greater or lesser extent by a person skilled in the art of nonimaging optics (Winston, Miñano, Benitez, "Nonimaging Optics", Elsevier 2005; J. Chaves, "Introduction to Nonimaging Optics", CRC press, 2008).

Modifications of the device of FIG. 5 are shown in FIGS. 16 to 20.

Figure 16:
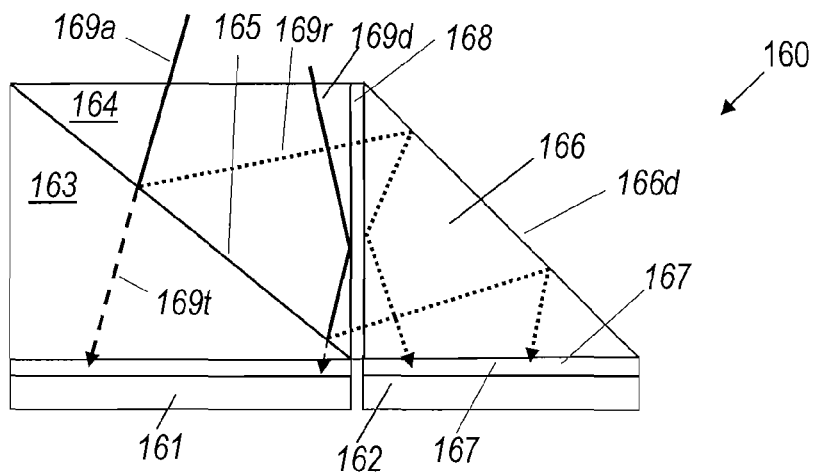
FIG. 16 is a schematic cross-sectional view of another form of photovoltaic device.

FIG. 16 shows a simple way to modify the device of FIG. 5. Photovoltaic device 160 comprises triple junction cell 161; adjacent coplanar secondary cell 162; right-triangle prism 163 positioned atop cell 161; adjacent right-triangle prism 164 with a common diagonal coated with spectrum splitting filter 165; right-triangle prism 166 atop cell 162, encapsulant layers 167 between respective prisms and cells, and gap 168, which can be air or encapsulant filled, joining prisms 164 and 166. Air within gap 168 will require AR coatings on the adjacent prism surfaces. As in FIG. 5, incoming ray 169a is split by filter 165. Reflected ray 169r crosses gap 168, reflects off sloping face 166d of prism 166, and enters external silicon cell 162. Transmitted ray 169t proceeds to, triple-junction cell 161. Gap 168 deflects input ray 169d, to ensure that all light first hits filter 165 before it can hit cell 162. External diagonal surface 166d may be mirror coated if needed to redirect all light downward to secondary cell 162. The prisms are made separately and glued to the cells with low index encapsulant 167, which also acts to capture light reflected off the gridlines (not shown) The top side of prism 164 acts as the system entry aperture. Alternatively, prisms 164 and 166 can be manufactured as one piece.

Figure 17:
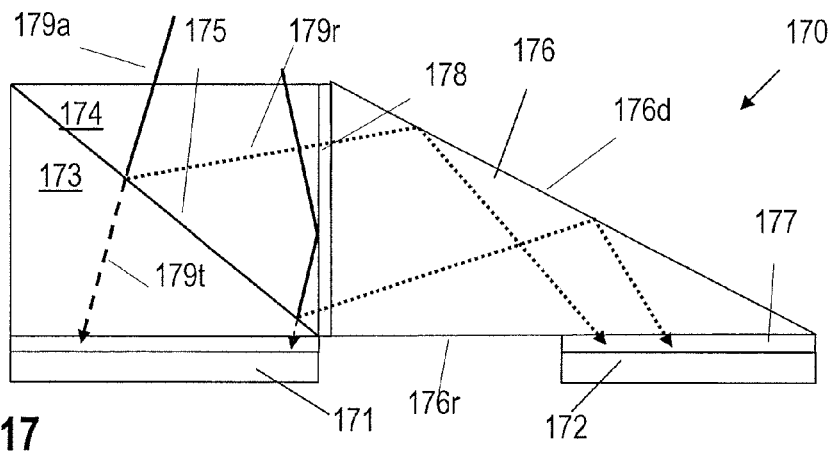
FIG. 17 is a schematic cross-sectional view of a further form of photovoltaic device.

FIG. 17 shows photovoltaic device 170, comprising primary triple-junction cell 171, secondary cell 172 coplanar with but spaced from primary cell 171, equilateral right-triangle prisms 173 and 174, elongated right-triangle prism 176 with the left part of its bottom surface, between cells 171 and 172, acting as TIR reflector 176r and the remainder coated by low-index encapsulant 177, bonding prism 176 to secondary cell 172. Elongated prism 176 is joined to upper prism 174 by low-index gap 178. The large angle of diagonal reflecting face 176d of elongated prism 176 guarantees TIR of all rays, so no metal coating is needed. Also, any reasonable separation of the cells can be accommodated. Exemplary rays 179a, 179b, 179c, etc. correspond to the rays shown in FIG. 16.

Figure 18:
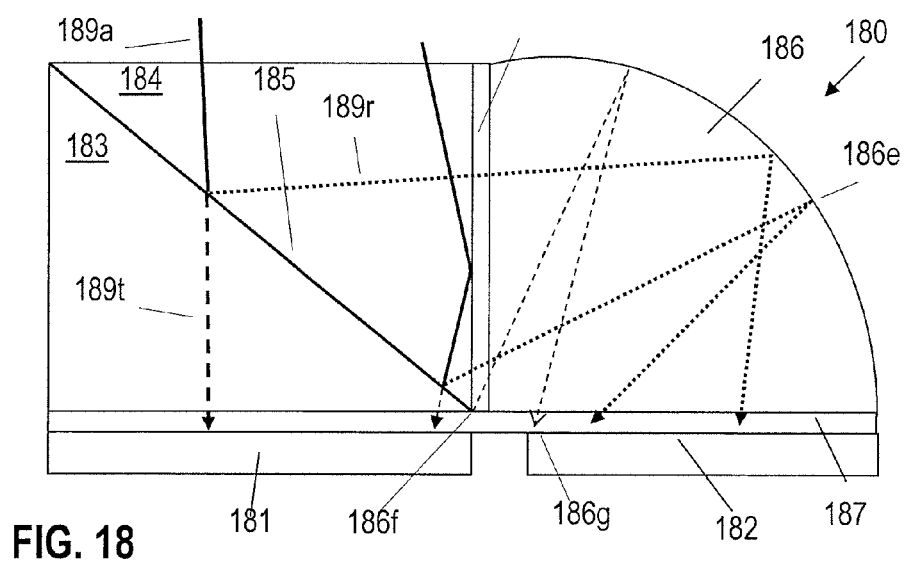
FIG. 18 is a schematic cross-sectional view of another form of photovoltaic device.

FIG. 18 shows photovoltaic device 180, comprising primary triple-junction cell 181, secondary cell 182, encapsulant 187, equilateral right-triangle prisms 183 and 184 with spectrum-splitting filter 185 on their diagonal, elliptical prism 186 with foci at 186f, at the bottom edge of band-stop mirror 185, and 186g, at the inner edge of external cell 182 is joined to upper prism 184 by low-index gap 188. The elliptical surface 186e acts as a bundle rotator, using a reflective coating. If the foci 186f, 186g coincide, is the ellipse becomes circular. As shown in FIG. 18, the ellipse 186e has an eccentricity only slightly non-zero, so that the gap between the cells must be small. Exemplary rays 189a, 189r, 189t, etc. are shown as previously.

Figure 19:
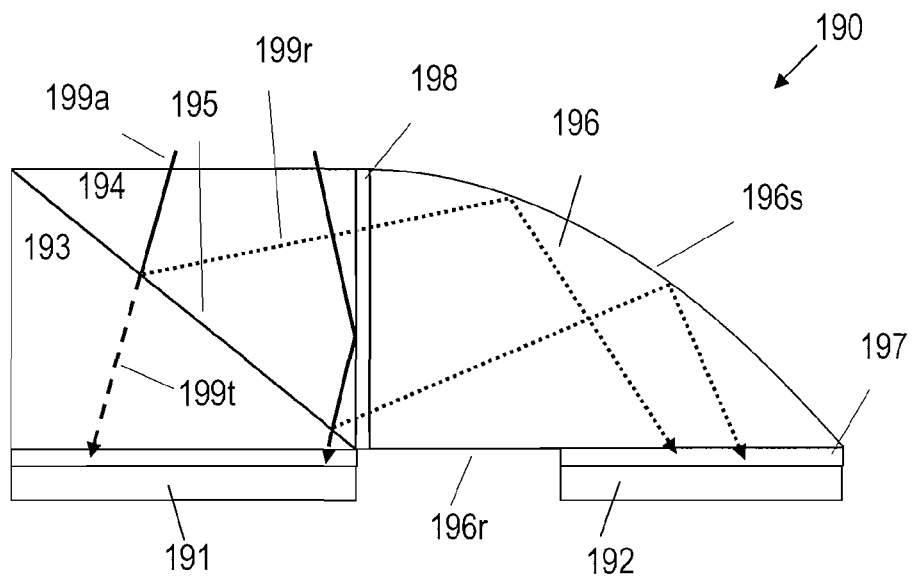
FIG. 19 is a schematic cross-sectional view of a further form of photovoltaic device.

FIG. 19 shows photovoltaic device 190, comprising triple junction cell 191, secondary cell 192, right-triangle prisms 193 and 194 with common diagonal having spectrum-splitting filter 195 thereupon, and right-angle curvilinear prism 196 with equiangular spiral cross-section 196s and planar bottom surface 196r joined to upper prism 194 by low-index gap 198. This spiral shape enables TIR of all rays, as well as optimum power transmission and comparatively uniform irradiance on the cell. Low-index encapsulant 197 couples the cells to their respective prisms. Similarly to FIG. 17, there is then a substantial gap between the cells 191 and 192. The tilt angle of the band-stop mirror surface 195 can be particularly designed to ensure that no rays reflected off it will hit surface 196r, and in that case it is not optically active. Exemplary rays 199a, 199b, 199c, etc. are shown as previously.

Figure 20:
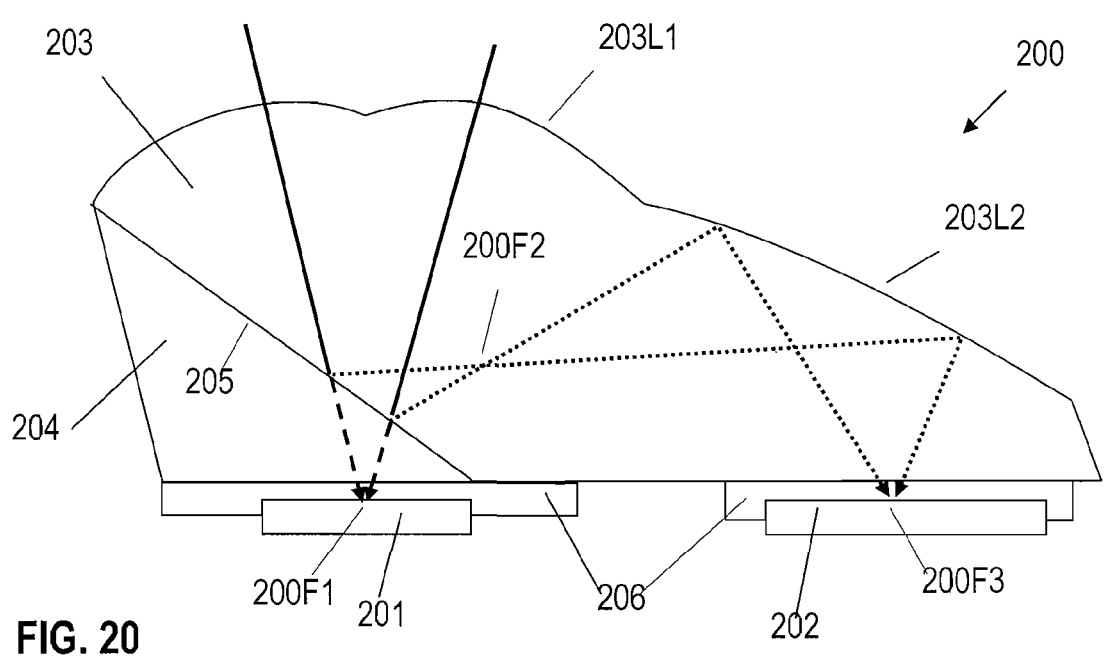
FIG. 20 is a schematic cross-sectional view of another form of photovoltaic device.

FIG. 20 shows another embodiment in which the entry aperture of the device is no longer the top. This device is no longer a flow-line reflector like those in FIGS. 16 and 17 but a sequential one (using the SMS nomenclature). FIG. 20 shows another embodiment in which the entry aperture of the device is no longer the top of the upper prism 54, etc., but the light is focused onto the primary photovoltaic cell 201 at 204.

FIG. 20 shows photovoltaic device 200, comprising triple-junction 201, secondary cell 202, upper prism 203, lower prism 204, block-band filter 205 on the diagonal surface between the two prisms, and low-index encapsulant layers 206 coupling the cells to the prisms. Incoming light is focused onto the primary photovoltaic cell 201, at focal point 200F1, by a primary concentrator (not shown). This can be done with the Fresnel-Kohler concentrator disclosed in U.S. patent application Ser. No. 12/621,047 and International Patent Application No. PCT/US 09/64887, which are incorporated herein by reference in their entirety. A solid-dielectric secondary optical element 203L is formed by the surface of upper prism 203. The upper prism 203 also comprises the secondary prism corresponding to the separate secondary prism 176, 186, 196 of the embodiments above, eliminating the low-index layer 178, 188, 198 that in those embodiments coupled the upper prism to the secondary prism. The rays reflected by the filter 205 focus at secondary focal point 200F2. The remaining upper surface of upper prism 203 is shaped as flowline reflector 203L2, which reimages focal point 200F2 onto secondary cell 202 as focal point 200F3. An example of such a reflector is an ellipse with foci at the two focal points 200F2 and 200F3.

Because the incoming light is already converging, compared to the configurations in FIGS. 16 and 17, this configuration does not need the reflecting surfaces to touch the edge of the cells, allowing for an easier encapsulation process, in which the excess of silicone 206 beyond the sides of the photovoltaic cells 201 & 202 does not cause light leakage. The cutoff wavelengths of the filter 205 vary with the angle of incidence of the incoming light which, as shown in FIG. 20, has a substantial angular range ±α (as in FIG. 1). The effect of such shifts is merely that the cutoffs 65 & 66 or 75 & 76 of FIGS. 5 and 6 become less steeply sloping rather than the nearly vertical cliffs shown. As explained above, this shift can be allowed for in calculating the nominal cutoff wavelengths.

Figure 21:
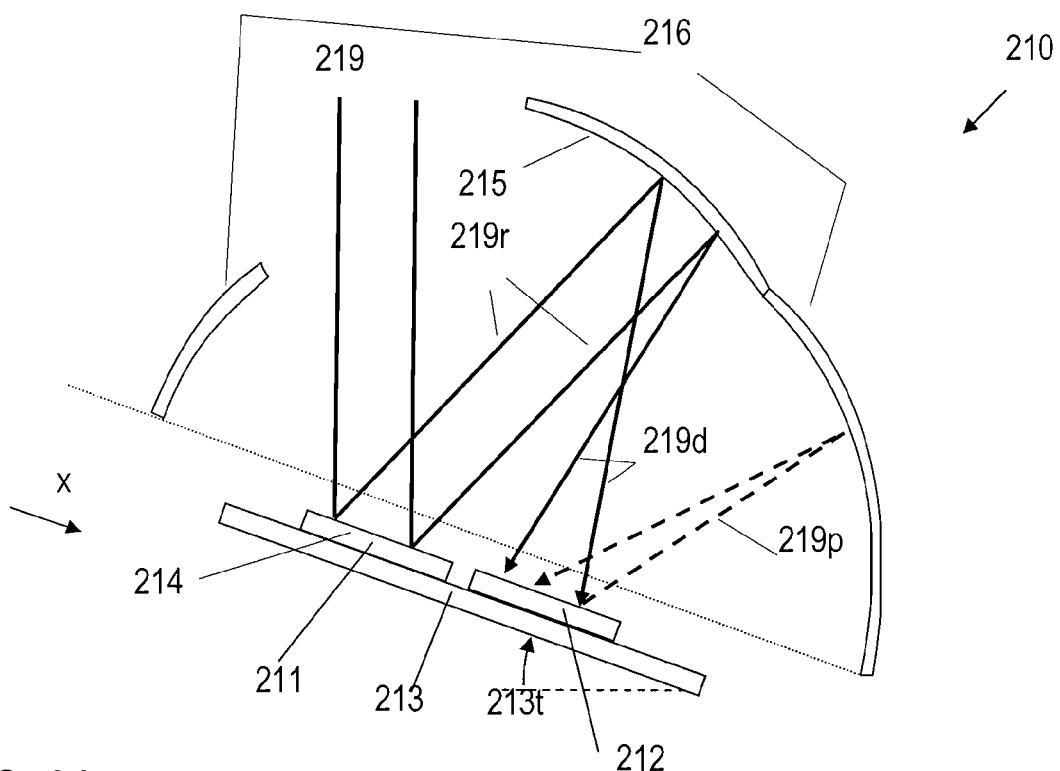
FIG. 21 is a schematic cross-sectional view of another form of photovoltaic device.

The devices shown in previous embodiments have the filter 52, etc. working inside a dielectric. FIG. 21 shows a sectional view of another design in which the filter works in air. Photovoltaic device 210 comprises multijunction cell 211 and coplanar silicon secondary cell 212, both installed on heat-spreading circuit board 213, with tilt angle 213t relative to a plane normal to the incoming light 219. The grid lines (not shown) of cell 211 have linear geometry and are parallel to the x-axis shown. A stop-band filter 214 is deposited on the front surface of multijunction cell 211. Reflected light rays 219r include those reflected by the stop-band filter 214, plus the light reflected by the gridlines and light rays reflected off the cell in spite of its customary AR coating. These reflected rays 219r are collected by a concave transfer mirror 215, which can be a first surface or second surface mirror. Mirror 215 redirects the reflected rays 219r as down going rays 219d towards the silicon cell 212. Mirror 215 can be an ellipsoid of revolution with foci on the centers of the cells and thus its major axis passing through both foci. The ellipsoid of mirror 215 extends down to the plane of the cells, in front of and behind the plane of the drawing, in order to collect the out-of-plane rays reflected by the gridlines, which run in the X direction in the plane of the drawing. Dotted rays 219p show such light being returned to secondary cell 212. In the solid angle that is neither covered by the transfer mirror 215 nor open to admit the incoming light, a conventional external cavity mirror 216 (as described in U.S. Pat. No. 5,291,331 to Miñano and Luque) can be added to recover the light diffusely reflected by the textured front surface of the silicon cell 212.

Figure 22:
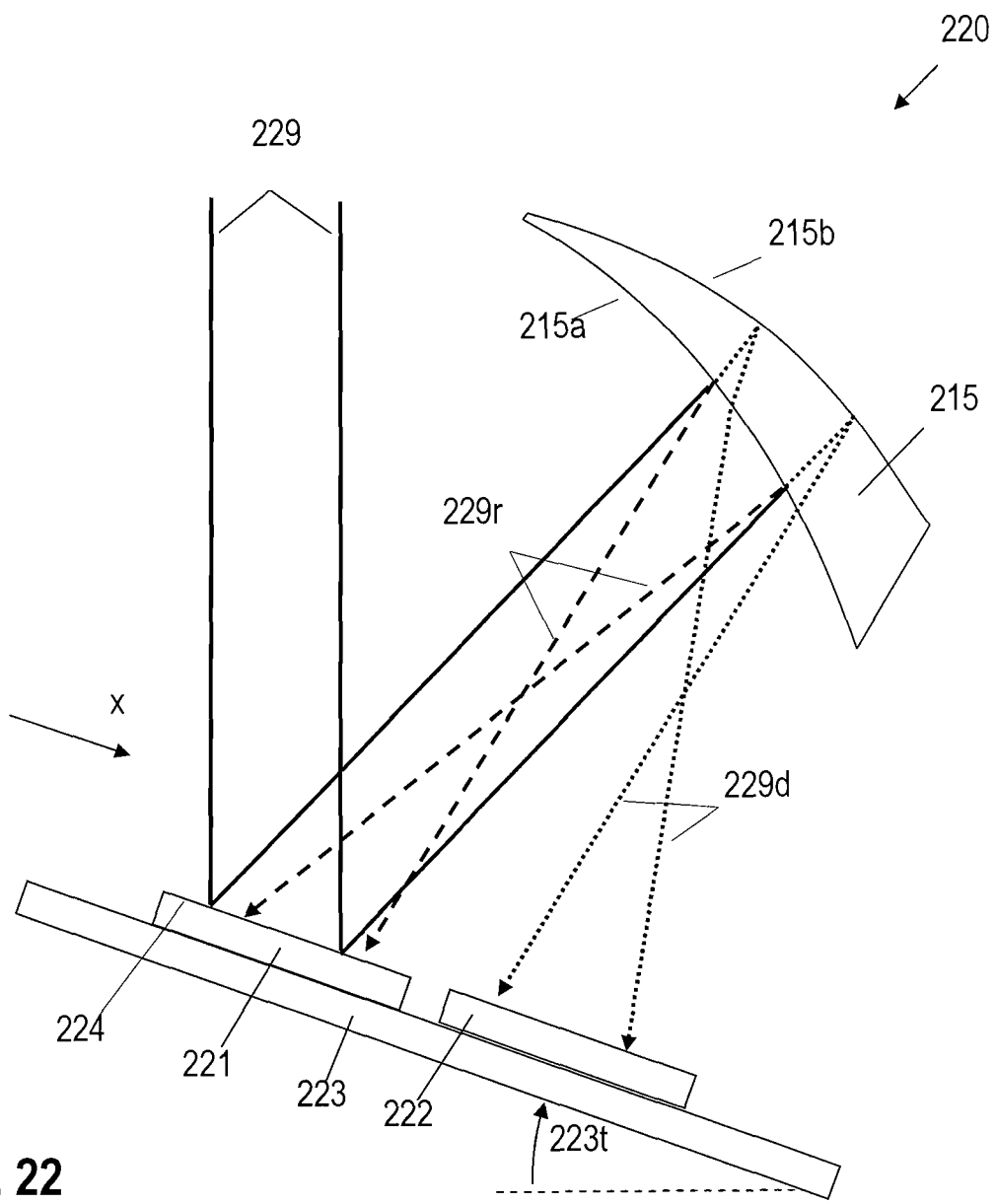
FIG. 22 is a schematic cross-sectional view of another form of photovoltaic device, similar to that of FIG. 21.
Figures 23, 24:
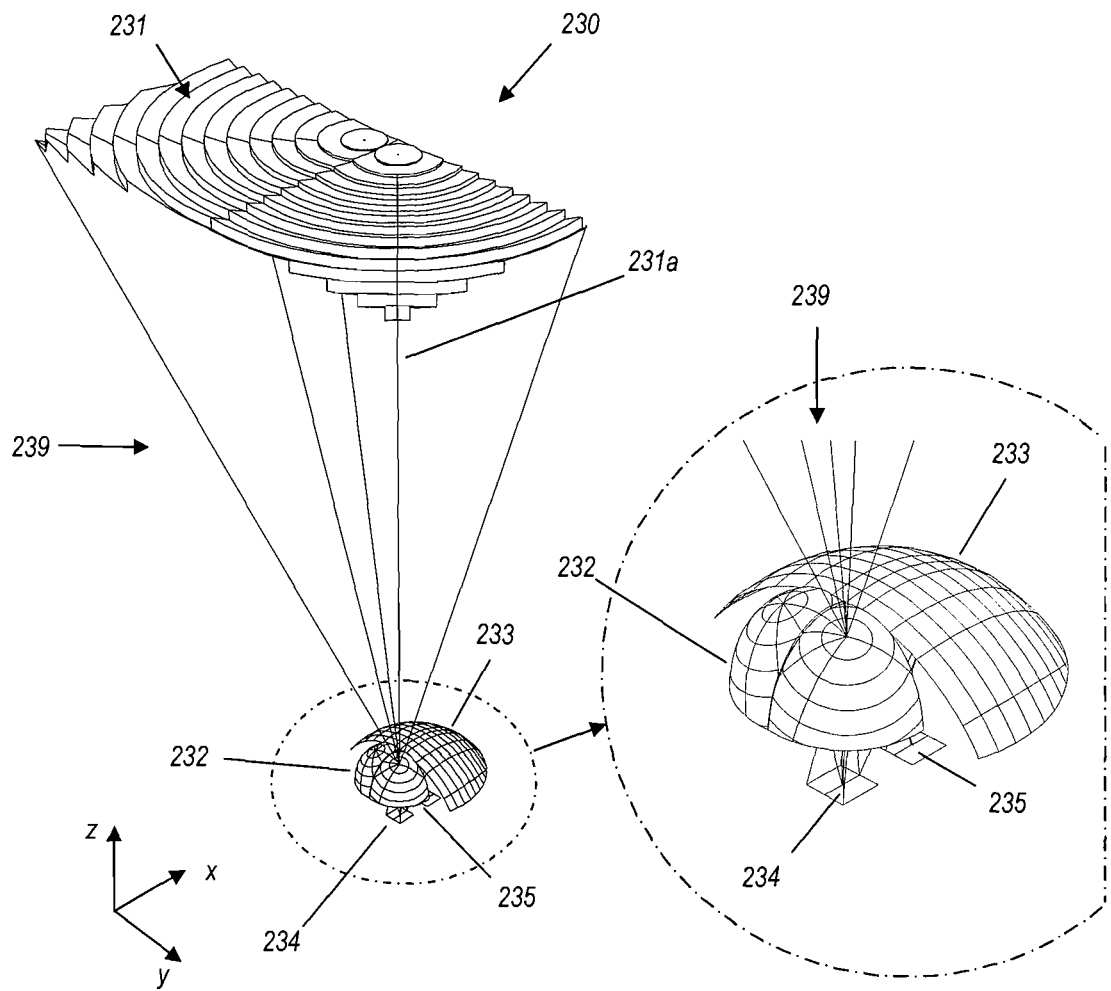
FIG. 23 is a perspective view of a photovoltaic device comprising a multi-segment Kohler concentrator.
FIG. 24 is a view of the secondary optics of the device of FIG. 23, to a larger scale.

FIG. 22 shows a modification of the mirror 215 of FIG. 21. Photovoltaic device 220 comprises triple-junction cell 221, coplanar secondary cell 222, both on common heat-spreading circuit board 223, tilted at angle 223t from the perpendicular to incoming light 229. Device 220 further comprises lensed mirror 215, shaped as a curved wedge in cross-section. The front surface 215a of the mirror has a short-pass filter to reflect back to the multijunction cell 221 the rays 229r that are over 1200 nm, because silicon is not sensitive to them but germanium is. The shape of front surface 215a is that of a conventional external cavity mirror for the multijunction cell (as described in U.S. Pat. No. 5,291,331 to Miñano and Luque). In contrast, the rear surface 215b of the mirror has a reflective coating and is shaped to reflect rays 229d from the multijunction cell 221 to the silicon cell 222, taking into account the refraction on the front surface 215a. Such a free-form design is a generalized Cartesian Oval, one that couples the refracted spherical wavefronts centered on the two cells.

When any of these embodiments are to be used as a receiver for a solar concentrator, the filter and grid-line pitch design are tailored for the prevailing solar spectrum (e.g., the standard AM1.5D solar spectrum that was used above). For example, if a UV-stabilized acrylic-based Fresnel lens is the primary optical element, the absorption of the acrylic in the IR and UV regions is not negligible, and thus will affect the incident spectrum.

The cells in FIGS. 21 and 22 are tilted with respect to the central direction of the incoming light. Such light can be collected from the sun with a rotationally symmetric flat Fresnel lens with a square truncated contour and with axis parallel to the vertical direction in FIGS. 21 and 22. The f-number of the lens matches the numerical aperture of these photovoltaic devices. Alternatively, the flat Fresnel lens can be parallel to the plane of the cells but be designed off-axis, so the optical axis of the Fresnel lens is not at the center of the square cut out of it.

Figures 25, 26:
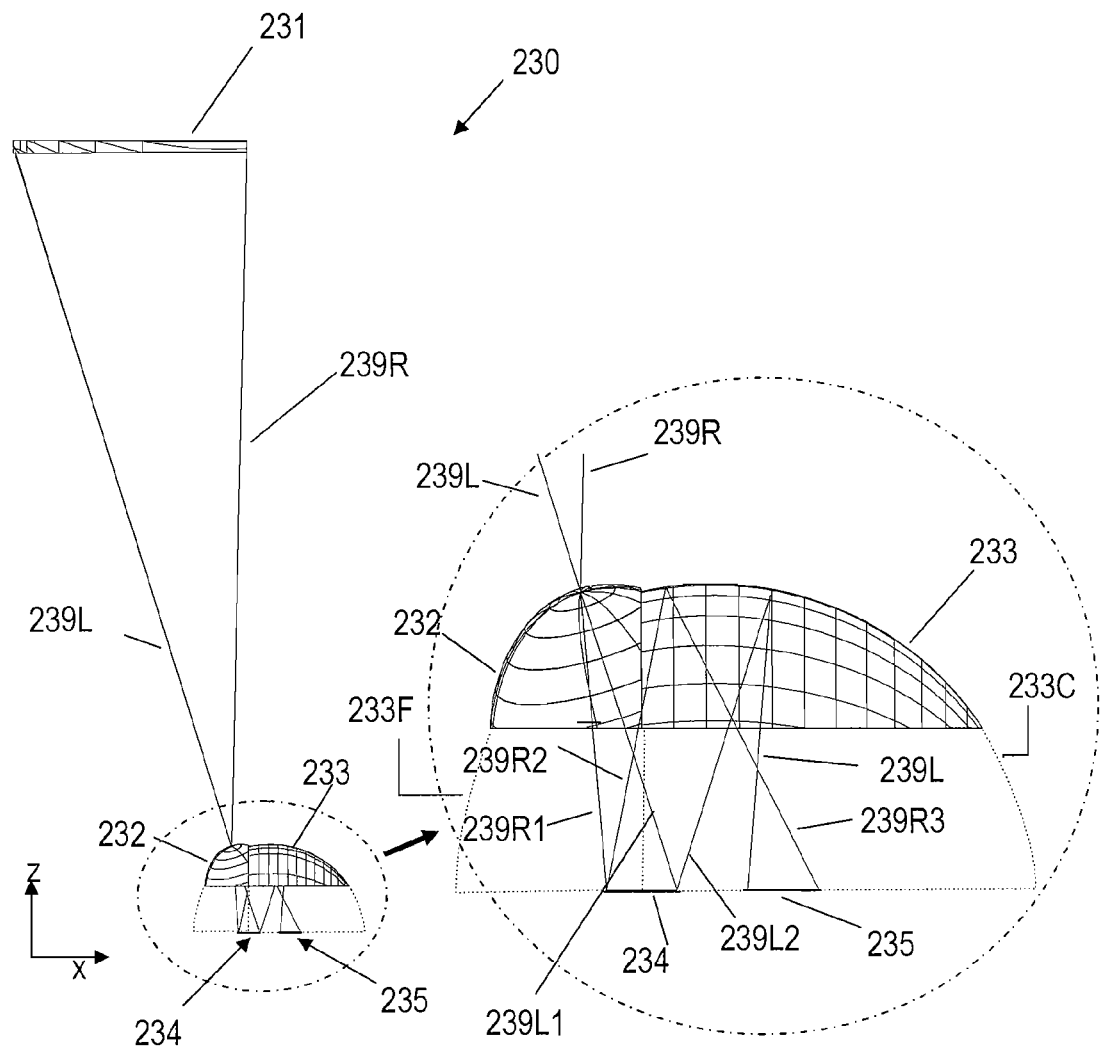
FIG. 25 is a side view of a device similar to that of FIG. 23.
FIG. 26 is a view of the secondary optics of the device of FIG. 25, to a larger scale.

FIGS. 23 to 26 show views of an off-axis concentrator that is not solely a Fresnel lens, but also a Fresnel-R Köhler concentrator, comprising Fresnel lens 231 with decentered symmetry axis 231a, and secondary lens 232. They jointly concentrate sunlight (shown by edge rays 239) on the multi-junction cell 234, see rays 239L, 239R, on top of which there is the stop-band filter (not shown). This is the Fresnel-R concentrator device, disclosed in above-referenced U.S. patent application Ser. No. 12/621,047 and International Patent Application No. PCT/US 09/64887 by Miñano et al., which can produce good uniformity of cell illumination and high concentration over a relatively wide acceptance angle (which eases tracking). For 500× geometric concentration, the acceptance angle of the concentrator in FIGS. 23 to 26 provides an acceptance angle about ±1°. FIG. 25 shows inclined edge ray 239L and more vertical edge ray 239R proceeding from primary lens 231 to secondary optical element 232, respectively becoming edge rays 239L1 and 239R1 going to triple-junction cell 234. The edge rays are reflected off cell 234 as rays 239L2 and 239R2, respectively. Mirror 233 will send this light reflected by the multijunction cell towards the silicon cell 235, as rays 239L3 and 239R3. The secondary concentrating lenses 232 and mirror 233 can be made as a single dielectric optical element with a reflective coating on surface 233. Surface 233 is shown truncated in FIGS. 23 to 26 for the sake of clarity, but actually extends up to the plane of the cells, as indicated by dotted line 233C in FIG. 26. As in the case of devices in FIGS. 21 and 22, the remaining solid angle of the cells can be filled with a conventional confining cavity (as described in U.S. Pat. No. 5,291,331 by Miñano and Luque) for the multijunction cell or for the silicon cell, indicated by 233F in FIG. 26.

One variation of the embodiments in FIGS. 21 to 26 has no silicon cell and instead makes the cavities confine all the non-absorbed radiation on back onto the multijunction cell. In this case, the grid line shading losses will be reduced by recycling any light reflected off the gridlines, increasing the overall conversion efficiency.

FIGS. 27 and 28 show a Fresnel-R Köhler with 4 symmetric sectors 272 in which such a cavity 273 recycles light back into a lone multijunction cell 274. Photovoltaic concentrator 270 comprises Fresnel primary lens 271, secondary lens 272, recycling cavity 273, and triple-junction solar cell 274. Primary lens 271 can be seen to comprise four off-axis Fresnel lenses, each focusing rays 275 onto the surface of its respective quadrant of secondary lens 272. Each of these secondary lens quadrants in turn images onto cell 274 the square outline of lens 271, via refracted rays 276. Recycling cavity 273 encloses cell 274 and returns light to it, as with rays 277.

The previous preferred embodiment concentrated the light of four sub-lenses onto one cell. It is possible to instead have a separate secondary optics and cell for each quadrant. FIGS. 29 and 30 respectively show a side and a top view of photovoltaic concentrator 290, comprising primary Fresnel lens 291 and four secondary assemblies 292, one of which is shown in more detail in FIGS. 31 to 33. The secondary assembly 292 in turn comprises two solid dielectric elements 293 and 294, with a band-pass filter 295 between them. FIG. 30 shows how the underside of element 293 is a lens that concentrates the light transmitted by the filter 295 onto silicon cell 301, while element 294 concentrates (by TIR) the light reflected upward by filter 295 onto a multijunction cell 302, bonded to the planar bottom surface of element 296. The multijunction cell 302 is tilted with respect to the light impinging on it (i.e., the direction vector of the rays has a positive x-coordinate), as shown by chain-dotted rays 305 in FIG. 31. With the gridlines parallel to that x-axis, a conventional confining cavity 296 will recover the light reflected by the grid lines and also light reflected by the cell surface (particularly the longer IR wavelengths, for which the cell AR coatings are not usually optimized), as shown by dashed rays 310 in FIG. 31. An additional conventional confining cavity 297 can be added around the silicon cell 301 to recover light reflected by it. FIG. 30 shows the arrangement of the Fresnel primary lens 291 and four secondary elements 292, with the optical axis (Z axis) of each square segment of the Fresnel lens passing through the middle of one side of the segment.

When comparing the embodiment in FIGS. 29 to 33 with that of FIGS. 25 to 28, the light impinging on the filter 295 in FIG. 33 has incidence angles in the 20° to 30° range, while in FIGS. 25 to 28 it is in the 0 to 35° range. This higher collimation makes the filter design easier. The secondary assembly 292 of FIGS. 29 to 33 has a number of practical features. The two photovoltaic cells 301 and 302 are coplanar, on a device base-plane that, as shown in FIG. 29, is common to all four assemblies 292 of the concentrator 290. The common base-plane facilitates mounting on a common electronics board and/or heat sink. The silicon cell 301 is outside the body of the secondary optical element 293, 294, 296, in a location with low heat load and easy ventilation and cooling. The tilted incidence of the light on the multijunction cell 302 confines the reflected rays vertically, as shown FIG. 31, and in combination with the encircling reflector 296 allows gridlines of arbitrary profile to be used. This device can thus be manufactured with existing multijunction cells, rather than requiring a specially profiled triangular gridlines.

Table 4 shows an example of bandpass filter design suitable for the device of FIGS. 29 to 33.

Figure 34:
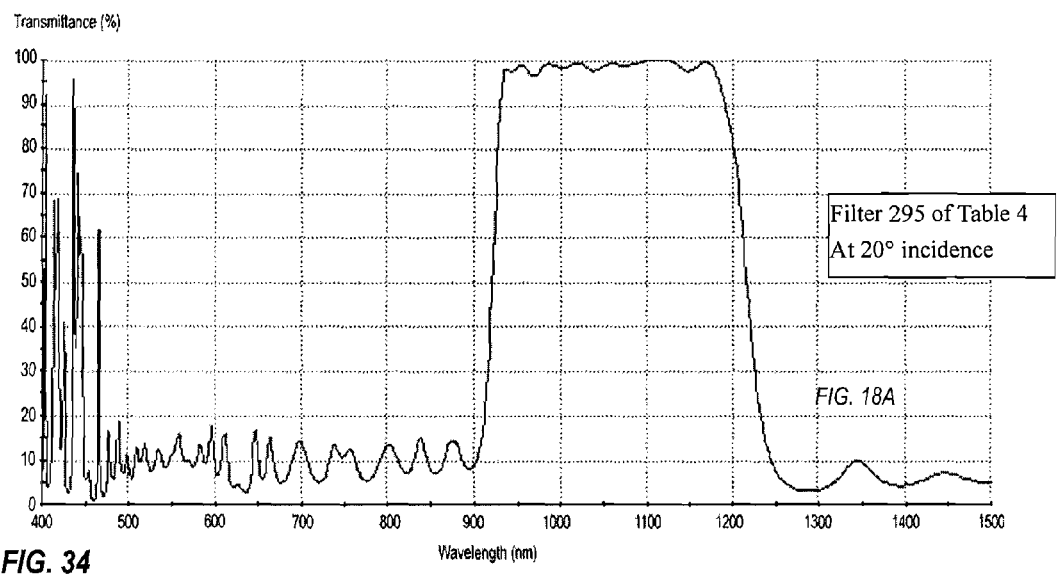
FIGS. 34, 35, and 36 are spectral transmittance curves for a band-pass filter at three angles of incidence.
Figure 35:
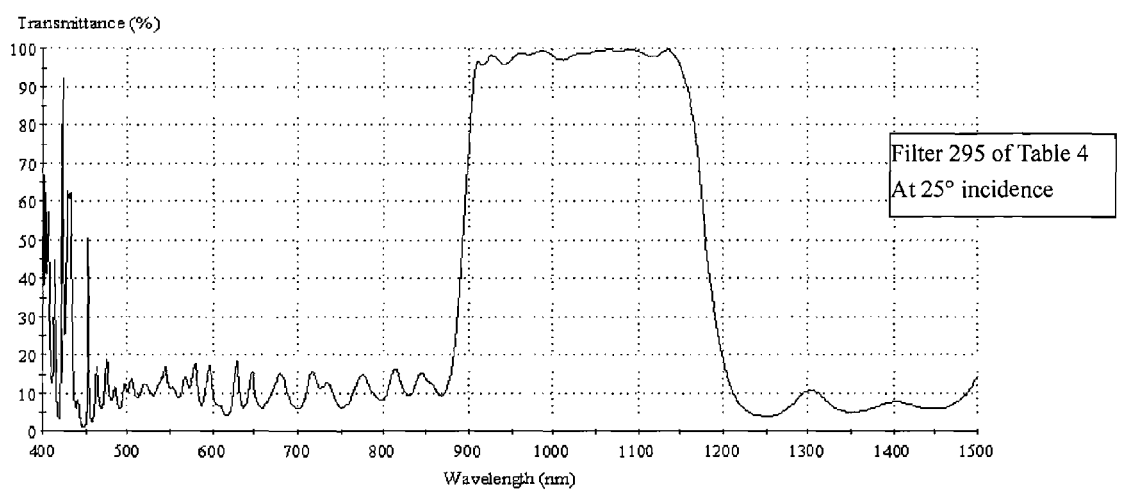
Figure 36:
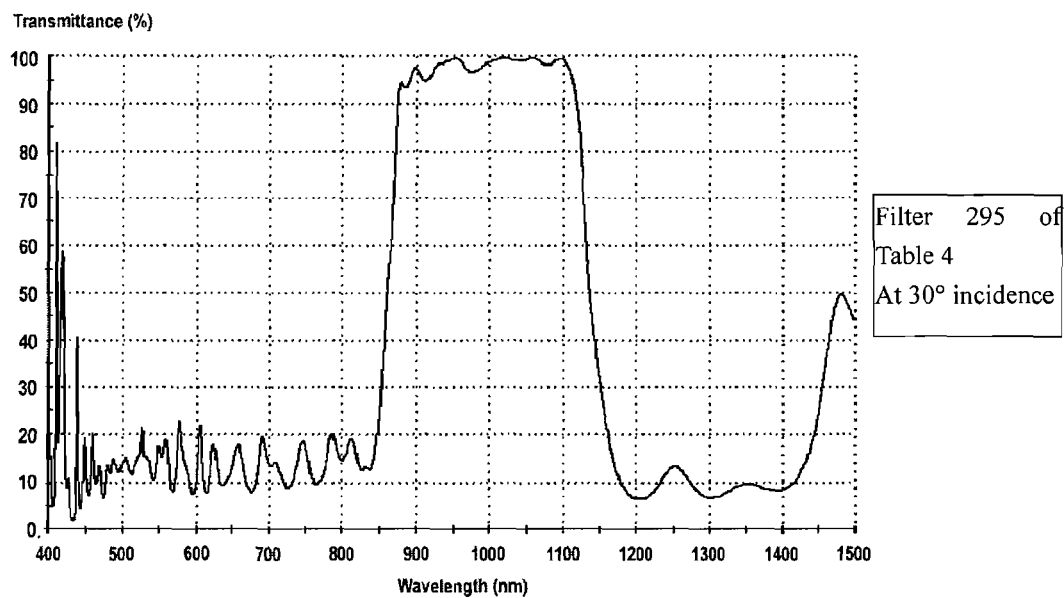

FIGS. 34 to 36 show the spectral transmission curves of filter 295 for incidence angles 20°, 25°, and 30°. The calculation of cell photocurrents in the device of FIGS. 29 to 33 leads to around 47% efficiency with the 40% multijunction cell and the 27% silicon cells, the spectral responses of which are shown in FIGS. 14 and 15. Such efficiency is obtained with the following current balance for the four junctions:

$$I_{SC,AJ} = I_{SC,EXT} \approx 0.95 I_{SC,MIDDLE} \approx I_{SC,BOTTOM} \approx 1.05 I_{SC,TOP}$$

Therefore, the silicon cell is limiting the overall photocurrent of the tandem cells by 5%, which is also the excess current of the top cell. A simple adjustment of this filter design to balance the currents comprises increasing the filter transmissivity below 600 nm, in order that the excess light absorbed by the top cell goes towards the silicon cell instead. After that adjustment, the relative increase of 5% of the efficiency would lead to 49% overall.

TABLE 4

| Layer | Material | Packing Density | Refractive Index | Extinction Coefficient | Optical Thickness (FWOT) | Physical Thickness (nm) | Geometric Thickness |
|---|---|---|---|---|---|---|---|
| Medium | Glass | | 1.50984 | 0 | | | |
| 1 | Ta2O5 | 1 | 1.992 | 0.00002 | 0.057278 | 24.44 | 0.028754 |
| 2 | SiO2 | 1 | 1.45252 | 0 | 0.188925 | 110.56 | 0.130067 |

TABLE 4-continued

| Layer | Material | Packing Density | Refractive Index | Extinction Coefficient | Optical Thickness (FWOT) | Physical Thickness (nm) | Geometric Thickness |
|---|---|---|---|---|---|---|---|
| 3 | Ta2O5 | 1 | 1.992 | 0.00002 | 0.169468 | 72.31 | 0.085075 |
| 4 | SiO2 | 1 | 1.45252 | 0 | 0.180959 | 105.9 | 0.124583 |
| 5 | Ta2O5 | 1 | 1.992 | 0.00002 | 0.15001 | 64.01 | 0.075306 |
| 6 | SiO2 | 1 | 1.45252 | 0 | 0.037387 | 21.88 | 0.025739 |
| 7 | Ta2O5 | 1 | 1.992 | 0.00002 | 0.189932 | 81.05 | 0.095347 |
| 8 | SiO2 | 1 | 1.45252 | 0 | 0.152834 | 89.44 | 0.10522 |
| 9 | Ta2O5 | 1 | 1.992 | 0.00002 | 0.137507 | 58.68 | 0.06903 |
| 10 | SiO2 | 1 | 1.45252 | 0 | 0.189727 | 111.03 | 0.130619 |
| 11 | Ta2O5 | 1 | 1.992 | 0.00002 | 0.126599 | 54.02 | 0.063554 |
| 12 | SiO2 | 1 | 1.45252 | 0 | 0.152278 | 89.11 | 0.104837 |
| 13 | Ta2O5 | 1 | 1.992 | 0.00002 | 0.192808 | 82.27 | 0.096791 |
| 14 | SiO2 | 1 | 1.45252 | 0 | 0.221763 | 129.77 | 0.152675 |
| 15 | Ta2O5 | 1 | 1.992 | 0.00002 | 0.371321 | 158.45 | 0.186406 |
| 16 | SiO2 | 1 | 1.45252 | 0 | 0.062495 | 36.57 | 0.043025 |
| 17 | Ta2O5 | 1 | 1.992 | 0.00002 | 0.20315 | 86.69 | 0.101983 |
| 18 | SiO2 | 1 | 1.45252 | 0 | 0.263574 | 154.24 | 0.18146 |
| 19 | Ta2O5 | 1 | 1.992 | 0.00002 | 0.189036 | 80.66 | 0.094897 |
| 20 | SiO2 | 1 | 1.45252 | 0 | 0.133323 | 78.02 | 0.091787 |
| 21 | Ta2O5 | 1 | 1.992 | 0.00002 | 0.254212 | 108.47 | 0.127616 |
| 22 | SiO2 | 1 | 1.45252 | 0 | 0.251669 | 147.27 | 0.173264 |
| 23 | Ta2O5 | 1 | 1.992 | 0.00002 | 0.198707 | 84.79 | 0.099752 |
| 24 | SiO2 | 1 | 1.45252 | 0 | 0.261324 | 152.92 | 0.179911 |
| 25 | Ta2O5 | 1 | 1.992 | 0.00002 | 0.195289 | 83.33 | 0.098036 |
| 26 | SiO2 | 1 | 1.45252 | 0 | 0.194491 | 113.81 | 0.133899 |
| 27 | Ta2O5 | 1 | 1.992 | 0.00002 | 0.16653 | 71.06 | 0.083599 |
| 28 | SiO2 | 1 | 1.45252 | 0 | 0.353089 | 206.62 | 0.243087 |
| 29 | Ta2O5 | 1 | 1.992 | 0.00002 | 0.382947 | 163.41 | 0.192243 |
| 30 | SiO2 | 1 | 1.45252 | 0 | 0.083067 | 48.61 | 0.057188 |
| 31 | Ta2O5 | 1 | 1.992 | 0.00002 | 0.181768 | 77.56 | 0.091249 |
| 32 | SiO2 | 1 | 1.45252 | 0 | 0.267757 | 156.69 | 0.18434 |
| 33 | Ta2O5 | 1 | 1.992 | 0.00002 | 0.289305 | 123.45 | 0.145234 |
| 34 | SiO2 | 1 | 1.45252 | 0 | 0.55826 | 326.69 | 0.38434 |
| 35 | Ta2O5 | 1 | 1.992 | 0.00002 | 0.022342 | 9.53 | 0.011216 |
| 36 | SiO2 | 1 | 1.45252 | 0 | 0.240892 | 140.97 | 0.165844 |
| 37 | Ta2O5 | 1 | 1.992 | 0.00002 | 0.2805 | 119.69 | 0.140813 |
| 38 | SiO2 | 1 | 1.45252 | 0 | 0.179573 | 105.08 | 0.123628 |
| 39 | Ta2O5 | 1 | 1.992 | 0.00002 | 0.195346 | 83.36 | 0.098065 |
| 40 | SiO2 | 1 | 1.45252 | 0 | 0.421597 | 246.71 | 0.290252 |
| 41 | Ta2O5 | 1 | 1.992 | 0.00002 | 0.267625 | 114.2 | 0.13435 |
| 42 | SiO2 | 1 | 1.45252 | 0 | 0.222784 | 130.37 | 0.153378 |
| 43 | Ta2O5 | 1 | 1.992 | 0.00002 | 0.110708 | 47.24 | 0.055576 |
| 44 | SiO2 | 1 | 1.45252 | 0 | 0.24774 | 144.98 | 0.170559 |
| 45 | Ta2O5 | 1 | 1.992 | 0.00002 | 0.426506 | 181.99 | 0.21411 |
| 46 | SiO2 | 1 | 1.45252 | 0 | 0.277601 | 162.45 | 0.191117 |
| 47 | Ta2O5 | 1 | 1.992 | 0.00002 | 0.47953 | 204.62 | 0.240728 |
| 48 | SiO2 | 1 | 1.45252 | 0 | 0.523066 | 306.09 | 0.360109 |
| 49 | Ta2O5 | 1 | 1.992 | 0.00002 | 0.369532 | 157.68 | 0.185508 |
| 50 | SiO2 | 1 | 1.45252 | 0 | 0.359006 | 210.09 | 0.247161 |
| 51 | Ta2O5 | 1 | 1.992 | 0.00002 | 0.436448 | 186.24 | 0.2191 |
| 52 | SiO2 | 1 | 1.45252 | 0 | 0.547285 | 320.27 | 0.376783 |
| 53 | Ta2O5 | 1 | 1.992 | 0.00002 | 0.320629 | 136.81 | 0.160958 |
| 54 | SiO2 | 1 | 1.45252 | 0 | 0.385543 | 225.62 | 0.26543 |
| 55 | Ta2O5 | 1 | 1.992 | 0.00002 | 0.53585 | 228.65 | 0.269001 |
| 56 | SiO2 | 1 | 1.45252 | 0 | 0.455834 | 266.75 | 0.313823 |
| 57 | Ta2O5 | 1 | 1.992 | 0.00002 | 0.30539 | 130.31 | 0.153308 |
| 58 | SiO2 | 1 | 1.45252 | 0 | 0.230718 | 135.01 | 0.15884 |
| 59 | Ta2O5 | 1 | 1.992 | 0.00002 | 0.009956 | 4.25 | 0.004998 |
| 60 | SiO2 | 1 | 1.45252 | 0 | 0.2523 | 147.64 | 0.173698 |
| 61 | Ta2O5 | 1 | 1.992 | 0.00002 | 0.090204 | 38.49 | 0.045283 |
| 62 | SiO2 | 1 | 1.45252 | 0 | 0.05293 | 30.97 | 0.03644 |
| 63 | Ta2O5 | 1 | 1.992 | 0.00002 | 0.406763 | 173.57 | 0.204199 |
| 64 | SiO2 | 1 | 1.45252 | 0 | 0.248724 | 145.55 | 0.171236 |
| Substrate | Glass | | 1.50984 | 0 | | | |
| Total Thickness | | | | | 15.91171 | 8088.96 | 9.516429 |

Figure 37:
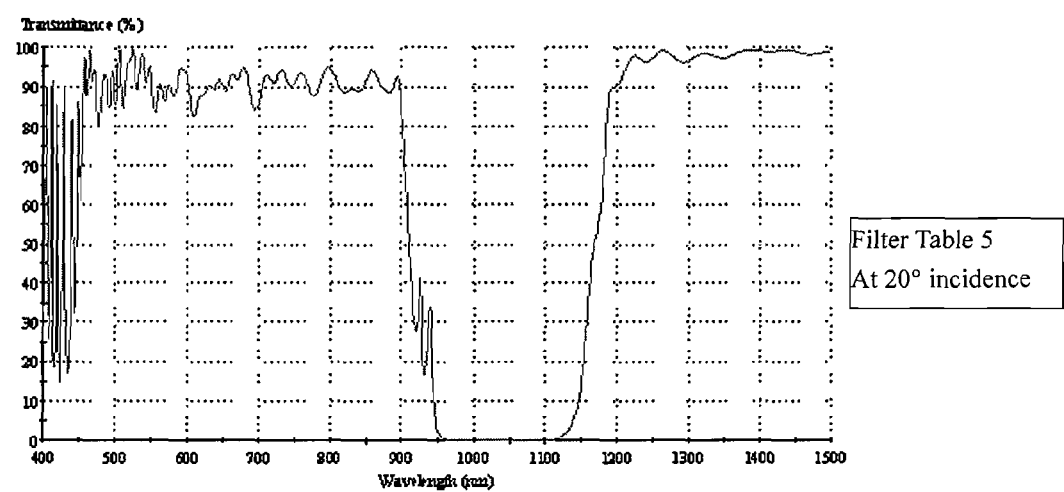
FIGS. 37, 38, and 39 are spectral transmittance curves for a band-stop filter at the same three angles of incidence as in FIGS. 34, 35, and 36.
Figure 38:
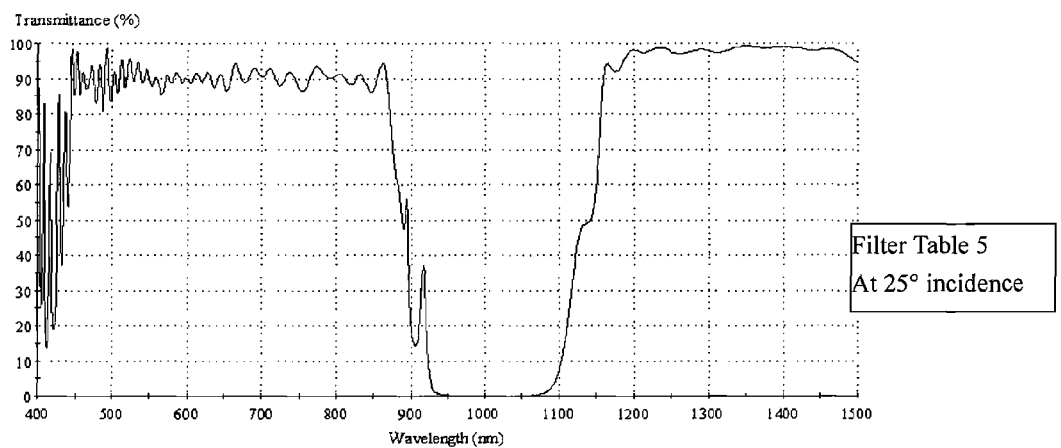
Figure 39:
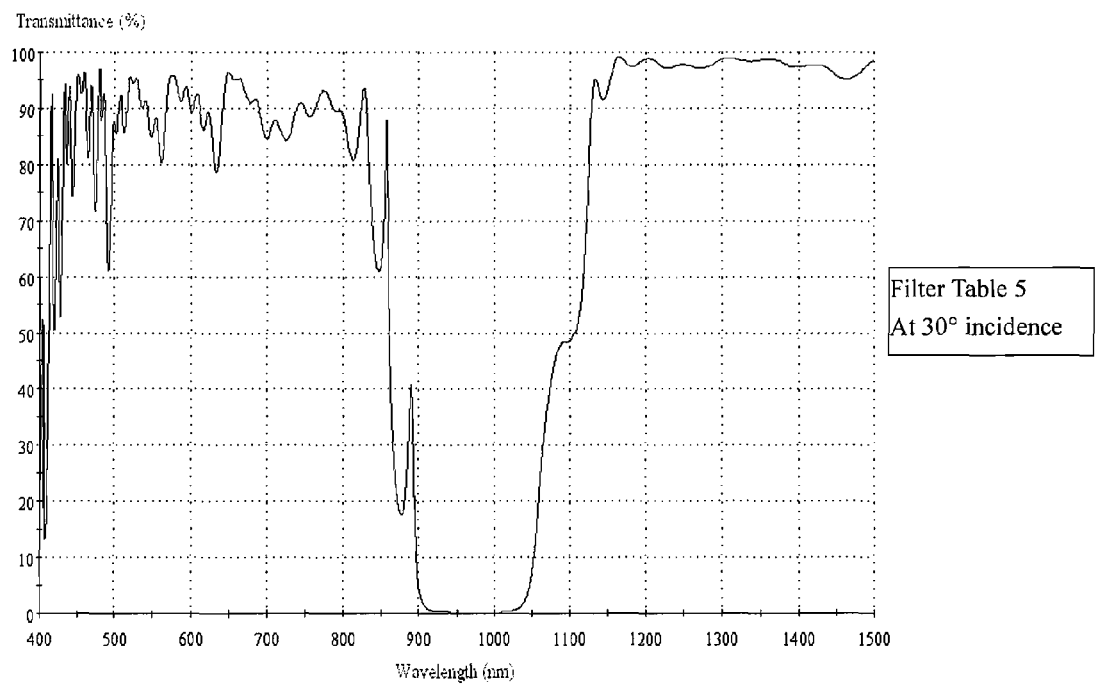

Table 5 lists a 54-layer block-band filter that works as well in a dielectric. As listed in Table 5, it is the dual of the previous passband filter. FIGS. 37 to 39 show the filter's spectral transmission curves, for respective incidence angles 20°, 25°, and 30°.

TABLE 5

| Layer | Material | Packing Density | Refractive Index | Extinction Coefficient | Optical Thickness (FWOT) | Physical Thickness (nm) | Geometric Thickness |
|---|---|---|---|---|---|---|---|
| Medium | Glass | | 1.5062 | 0 | | | |
| 1 | Ta2O5 | 1 | 1.992 | 0.00002 | 0.040018 | 22.1 | 0.02009 |
| 2 | SiO2 | 1 | 1.44921 | 0 | 0.027883 | 21.16 | 0.01924 |
| 3 | Ta2O5 | 1 | 1.992 | 0.00002 | 0.755226 | 417.04 | 0.37913 |
| 4 | SiO2 | 1 | 1.44921 | 0 | 0.049806 | 37.8 | 0.034367 |
| 5 | Ta2O5 | 1 | 1.992 | 0.00002 | 1.961162 | 1082.97 | 0.984519 |
| 6 | SiO2 | 1 | 1.44921 | 0 | 0.034166 | 25.93 | 0.023575 |
| 7 | Ta2O5 | 1 | 1.992 | 0.00002 | 0.021266 | 11.74 | 0.010676 |
| 8 | SiO2 | 1 | 1.44921 | 0 | 0.075605 | 57.39 | 0.05217 |
| 9 | Ta2O5 | 1 | 1.992 | 0.00002 | 0.058827 | 32.48 | 0.029532 |
| 10 | SiO2 | 1 | 1.44921 | 0 | 0.04028 | 30.57 | 0.027795 |
| 11 | Ta2O5 | 1 | 1.992 | 0.00002 | 0.214146 | 118.25 | 0.107503 |
| 12 | SiO2 | 1 | 1.44921 | 0 | 0.013298 | 10.09 | 0.009176 |
| 13 | Ta2O5 | 1 | 1.992 | 0.00002 | 0.145264 | 80.22 | 0.072924 |
| 14 | SiO2 | 1 | 1.44921 | 0 | 0.049402 | 37.5 | 0.034089 |
| 15 | Ta2O5 | 1 | 1.992 | 0.00002 | 0.295749 | 163.32 | 0.148468 |
| 16 | SiO2 | 1 | 1.44921 | 0 | 0.260198 | 197.5 | 0.179544 |
| 17 | Ta2O5 | 1 | 1.992 | 0.00002 | 0.197903 | 109.28 | 0.099349 |
| 18 | SiO2 | 1 | 1.44921 | 0 | 0.253039 | 192.06 | 0.174604 |
| 19 | Ta2O5 | 1 | 1.992 | 0.00002 | 0.244423 | 134.97 | 0.122702 |
| 20 | SiO2 | 1 | 1.44921 | 0 | 0.22202 | 168.52 | 0.153201 |
| 21 | Ta2O5 | 1 | 1.992 | 0.00002 | 0.257916 | 142.42 | 0.129476 |
| 22 | SiO2 | 1 | 1.44921 | 0 | 0.271816 | 206.32 | 0.187561 |
| 23 | Ta2O5 | 1 | 1.992 | 0.00002 | 0.234999 | 129.77 | 0.117971 |
| 24 | SiO2 | 1 | 1.44921 | 0 | 0.233756 | 177.43 | 0.161299 |
| 25 | Ta2O5 | 1 | 1.992 | 0.00002 | 0.248037 | 136.97 | 0.124516 |
| 26 | SiO2 | 1 | 1.44921 | 0 | 0.245165 | 186.09 | 0.169172 |
| 27 | Ta2O5 | 1 | 1.992 | 0.00002 | 0.259278 | 143.18 | 0.130159 |
| 28 | SiO2 | 1 | 1.44921 | 0 | 0.236543 | 179.54 | 0.163222 |
| 29 | Ta2O5 | 1 | 1.992 | 0.00002 | 0.247085 | 136.44 | 0.124039 |
| 30 | SiO2 | 1 | 1.44921 | 0 | 0.266577 | 202.34 | 0.183946 |
| 31 | Ta2O5 | 1 | 1.992 | 0.00002 | 0.234251 | 129.36 | 0.117596 |
| 32 | SiO2 | 1 | 1.44921 | 0 | 0.253406 | 192.34 | 0.174858 |
| 33 | Ta2O5 | 1 | 1.992 | 0.00002 | 0.247232 | 136.52 | 0.124112 |
| 34 | SiO2 | 1 | 1.44921 | 0 | 0.26084 | 197.99 | 0.179987 |
| 35 | Ta2O5 | 1 | 1.992 | 0.00002 | 0.239749 | 132.39 | 0.120356 |
| 36 | SiO2 | 1 | 1.44921 | 0 | 0.257704 | 195.61 | 0.177824 |
| 37 | Ta2O5 | 1 | 1.992 | 0.00002 | 0.241396 | 133.3 | 0.121183 |
| 38 | SiO2 | 1 | 1.44921 | 0 | 0.27164 | 206.18 | 0.18744 |
| 39 | Ta2O5 | 1 | 1.992 | 0.00002 | 0.228697 | 126.29 | 0.114808 |
| 40 | SiO2 | 1 | 1.44921 | 0 | 0.259081 | 196.65 | 0.178774 |
| 41 | Ta2O5 | 1 | 1.992 | 0.00002 | 0.243317 | 134.36 | 0.122147 |
| 42 | SiO2 | 1 | 1.44921 | 0 | 0.250814 | 190.38 | 0.173069 |
| 43 | Ta2O5 | 1 | 1.992 | 0.00002 | 0.237652 | 131.23 | 0.119303 |
| 44 | SiO2 | 1 | 1.44921 | 0 | 0.248933 | 188.95 | 0.171771 |
| 45 | Ta2O5 | 1 | 1.992 | 0.00002 | 0.257019 | 141.93 | 0.129026 |
| 46 | SiO2 | 1 | 1.44921 | 0 | 0.266207 | 202.06 | 0.183691 |
| 47 | Ta2O5 | 1 | 1.992 | 0.00002 | 0.041488 | 22.91 | 0.020827 |
| 48 | SiO2 | 1 | 1.44921 | 0 | 0.058677 | 44.54 | 0.040489 |
| 49 | Ta2O5 | 1 | 1.992 | 0.00002 | 0.066142 | 36.52 | 0.033204 |
| 50 | SiO2 | 1 | 1.44921 | 0 | 0.31831 | 241.61 | 0.219643 |
| 51 | Ta2O5 | 1 | 1.992 | 0.00002 | 0.084539 | 46.68 | 0.042439 |
| 52 | SiO2 | 1 | 1.44921 | 0 | 0.059614 | 45.25 | 0.041136 |
| 53 | Ta2O5 | 1 | 1.992 | 0.00002 | 0.074184 | 40.96 | 0.037241 |
| 54 | SiO2 | 1 | 1.44921 | 0 | 0.299876 | 227.62 | 0.206923 |
| Substrate | Glass | | 1.5062 | 0 | | | |
| Total Thickness | | | | | 12.46162 | 7933.05 | 7.211861 |

The system efficiency achieved with this stop-band filter would be about 46%, given the 40% multijunction cell and the 27% silicon cell, the spectral responses of which are shown in FIGS. 14 and 15. That efficiency can again be increased to 48% if we reduce reflectance by about 5.5% between 0 and 890 nm and move the filter cutoffs to the right (Left edge +20 nm approx, right edge +40 nm approx.). Such a redesign is, again, easily attainable.

Figure 40:
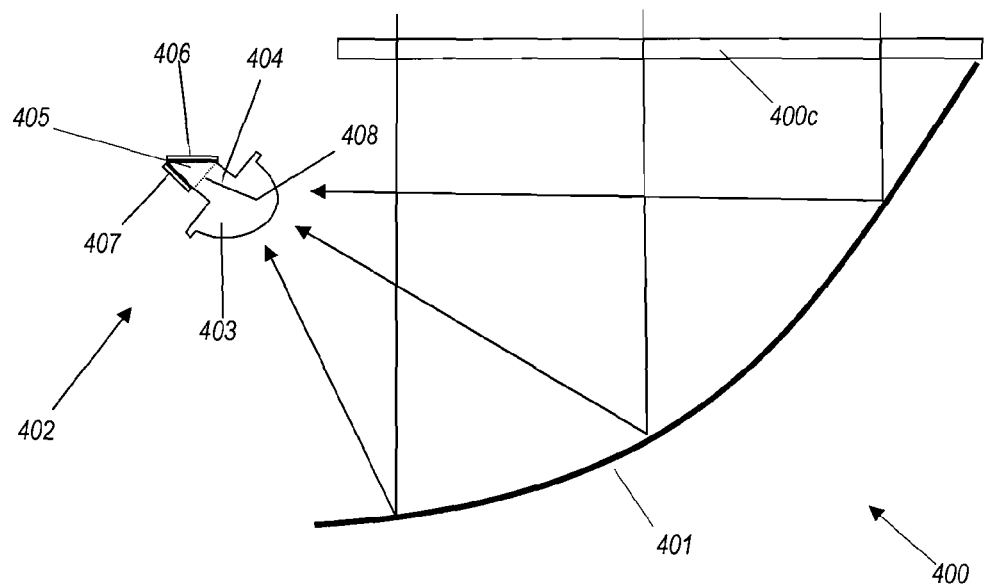
FIG. 40 is a schematic cross-sectional view of another form of photovoltaic device.

FIG. 40 shows photovoltaic concentrator 400, classified as an XR asymmetric free-form concentrator designed for a tilted receiver, as described in US pat application no. 2008/0223443. Concentrator 400 comprises protective cover 400*c*, reflector 401 and receiver 402, which in turn comprises lens 403, homogenizer prism 404, and prismatic element 405, which is identical except in orientation to the photovoltaic shown in FIG. 11 above, with multijunction cell 406 and secondary cell 407. The prism surface in front of the cell 406 or the cell front surface itself will be coated with the wavelength selective filter to reflect the light to be utilized by the secondary cell. The tilt angles of receiver 403 and prism 405 can be made equal so that the plane of the multijunction cell 406 is parallel to the cover 400*c*, making its alignment easier. Alternatively to the use of the secondary cell, the surface of secondary cell 407 can be mirror coated to send back the light reflected by multijunction cell 406. In both cases, light guidance can be improved by setting in line 408 at the boundary between homogenizer 404 and prism 405 an adequate low index material, as a silicone rubber.

Figure 41:
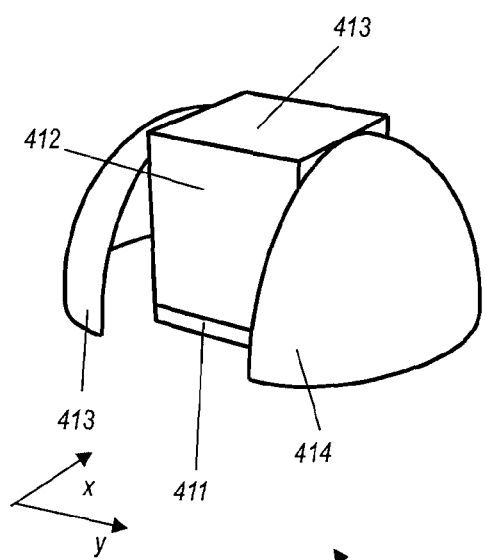
FIG. 41 is a perspective view of a secondary optical element for another solar photovoltaic device.
Figure 42:
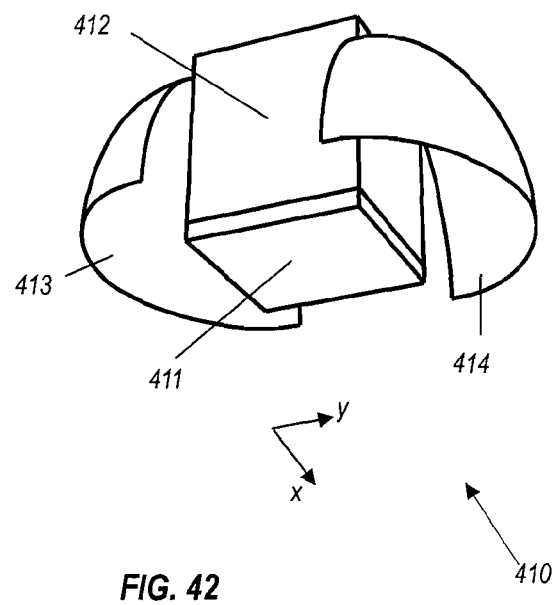
FIG. 42 is a perspective view of a secondary optical element for another solar photovoltaic device.

FIGS. 41 and 42 show photovoltaic receiver 410, comprising a multijunction solar cell 411, with triangular grid lines (not shown) as described in FIG. 1 and parallel to the x-axis shown. Cell 411 is attached to one face of a cuboidal solid dielectric prism 412 having entry aperture 413 formed by the face of prism 412 opposite multijunction cell 411. Prism 412 is bordered on two sides in the ±y directions by external reflective confining cavities 413 and 414. The base angles δ of the triangular gridlines (not shown) are chosen so that incident light from entry aperture 413 reflected off gridlines is directed towards the reflective cavities 413 & 414, which will return them to the cell.

Figure 43:
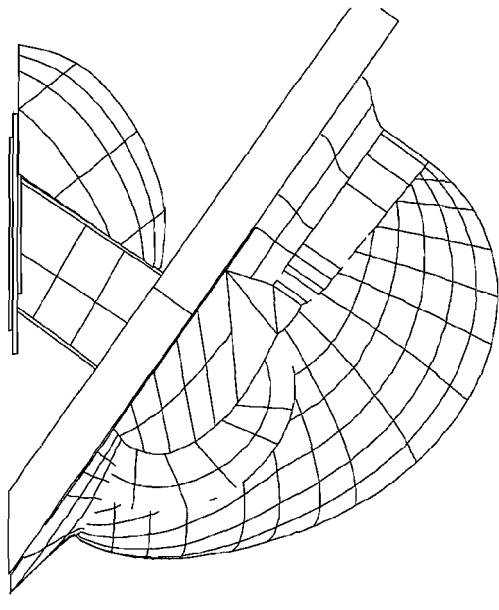
FIG. 43 is a side view of a secondary optical element for another solar photovoltaic device.
Figure 44:
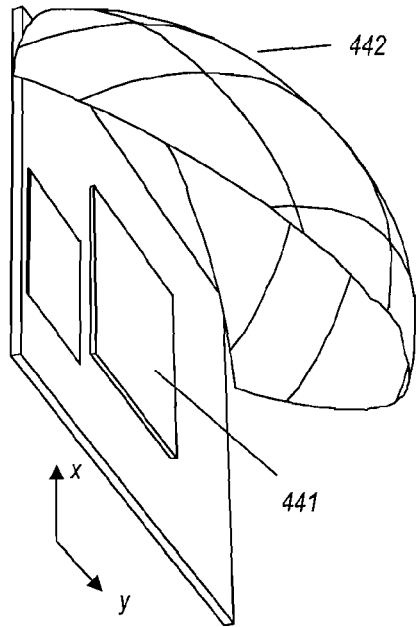
FIG. 44 is a perspective view of part of the device shown in FIG. 43.

For arbitrary cross section of a linear grid line, the cell can be tilted as described in previous embodiments. Such a tilted configuration is shown in FIGS. 43 and 44. In FIG. 43, the prism 433 has the cross-section of an asymmetric trapezoid instead of the cuboidal shape shown in FIGS. 41 and 42. In FIG. 44, the prism is omitted to make more visible the multijunction solar cell 441 and reflector 442 (corresponding to 431 and 432, respectively, of FIG. 43). The prism 433 acts as an integrating homogenizer receiving light from the secondary optics of the off-axis XR disclosed in US pat application no. 2008/0223443. Because of the slanting of the multijunction cell 441, the rays reflected off its gridlines (which run parallel to the x axis) are all sent in the +x direction, as shown in FIG. 12, so that only a single cavity 442 on the +x side of the prism (the side occupied by external silicon cell 66 in FIG. 12) is required in FIGS. 43 and 44.

FIGS. 45 and 46 are side and perspective views of an alternative configuration to FIG. 11. Photovoltaic device 450 comprises primary triple junction cell 451, secondary cell 452, and right angle prism 453 with diagonal front face 454. The filter (not shown) is placed directly on the surface of the triple junction cell 451 (or alternatively on the prism surface in contact with the cell), and the light reflected by the filter will hit front surface 454 of the prism 453 and TIR towards the secondary cell 452. The light reflected by the gridlines of primary cell 451 (preferably aligned parallel to the x axis) will also be directed towards the secondary cell 452 or to the surface 454, thereby to also TIR. This configuration is advantageous over that of FIG. 11 in that the incidence angles of the rays impinging on the filter are smaller in this configuration, and thus the filter performance improves. When a solid dielectric secondary optical element is to be coupled to this device (similar to the one in FIG. 11), a positive refractive index difference between the prism and the coupler will be needed to guarantee TIR on surface 454.

Various embodiments have been described, implementing different ones, or different combinations, of the novel concepts underlying the present application. The person having ordinary skill in the art will understand how features of different ones of those embodiments, and of those concepts, may be combined. In particular, even where the question has not been explicitly discussed, the skilled reader will understand where, and how, the specific gridline configurations shown in FIGS. 1-3 and 12 may be applied to other disclosed embodiments, where a TIR interface such as between layers 11 and 12 of FIG. 1 is appropriate and where that interface should be avoided to allow rays such as 98g to escape from the gridlined cell, and how the facet angles δ, $δ_1$, $δ_2$, should be selected to direct the outgoing light as desired.

Various modifications may be made to the described embodiments without departing from the scope and spirit of the invention as defined in the claims.

For example, as discussed with reference to FIG. 1, and as demonstrated by a comparison of the spectral characteristics of FIGS. 34-36 and 37-39, in many of the embodiments the multijunction cell and the external cell may be interchanged if a band-pass filter is substituted for a block-band filter or vice versa. Even where the question has not been explicitly discussed, the skilled person will understand in which of the embodiments such an interchange would be appropriate, and what consequential rearrangement of other components would be desirable.

The invention claimed is:
1. A photovoltaic device comprising:
a multi-junction photovoltaic cell;
a single junction photovoltaic cell; and
a wavelength-selective reflector comprising a multi-layer interference filter arranged to distribute incoming incident light between the single junction and multi-junction photovoltaic cells;
wherein the single junction photovoltaic cell has a bandgap intermediate between two of the band-gaps of the multi junction cell;
wherein the wavelength-selective reflector is a band-pass filter or block-band filter configured to direct incoming incident light within its pass band or block band to one of said single junction and multi-junction photovoltaic cells, and to distribute light at shorter wavelengths over both cells; and
wherein the combined efficiency of the multi junction and single junction photovoltaic cells under incoming incident sunlight is greater than the efficiency obtainable from the same multi junction cell alone, without the reflector.

2. The photovoltaic device of claim 1, wherein said wavelength-selective reflector comprises at least one partially reflective and partially transmissive surface.

3. The photovoltaic device of claim 1, wherein the wavelength-selective reflector transmits light to the multi-junction photovoltaic cell, and wherein incident light reflected from said front face of said multi-junction photovoltaic cell returns through the wavelength-selective reflector and falls on said single junction photovoltaic cell.

4. The photovoltaic device of claim 1, wherein said wavelength-selective reflector is arranged to apportion light of different wavelengths between the multi-junction and single junction photovoltaic cells such that with sunlight as the incident light the photocurrents from all four junctions are more nearly equal than the photocurrents of the three junctions of the multi-junction photovoltaic cell would be by itself receiving said incident incoming light.

5. The photovoltaic device of claim 1, wherein said multi-junction photovoltaic cell is a Ge—Ga(In)As—GaInP cell and said single junction cell is a silicon cell.

6. The photovoltaic device of claim 5, wherein said band-pass filter is transmissive at least between 890 and 1050 nm or said block-band filter is reflective at least between 890 and 1050 nm.

7. The photovoltaic device of claim 6, wherein said band-pass filter has a transmissivity ranging 9.5% to at least 12% for wavelengths less than 860 nm or said block-band filter has a reflectivity ranging 9.5% to at least 12% for wavelengths less than 860 nm.

8. The photovoltaic device of claim 5, wherein said band-pass filter is reflective at least for wavelengths longer than 1130 nm or said block-band filter is transmissive at least for wavelengths longer than 1130 nm.

9. The photovoltaic device of claim 1, further comprising at least one reflective surface covering part of said one photovoltaic cell and leaving exposed the remaining part.

10. The photovoltaic device of claim 9, wherein said at least one reflective surface covering part of said one photovoltaic cell and leaving exposed another part of the area of the said one photovoltaic cell comprises an electrical contact structure on a surface of said one photovoltaic cell.

11. The photovoltaic device of claim 10, wherein the electrical contact structure on a surface of said one photovoltaic cell comprises a grid of linear contacts narrow in width relative to the width of said one photovoltaic cell.

12. The photovoltaic device of claim 1, wherein said multi-junction photovoltaic cell comprises a front face upon which in operation incoming incident light falls on the photovoltaic cell, and further comprises an opaque connector structure overlying part of said front face, said connector structure comprising reflective facets angled oblique to the plane of said front face and acting to produce outgoing reflected light;
said device further comprising an interface parallel to and in front of said front face, said interface arranged to transmit incident light to said front face, and to reflect back towards said front face by total internal reflection said outgoing reflected light.

13. The photovoltaic device of claim 12, wherein said connector structure comprises a grid of conductors of triangular cross-section, with one face in electrical contact with said front face of said multi-junction photovoltaic cell.

14. A photovoltaic device comprising:
a multi-junction photovoltaic cell;
a single junction photovoltaic cell; and
a wavelength-selective reflector arranged to distribute incoming incident light between the single junction and multi-junction photovoltaic cells by transmitting some light and reflecting other light, said wavelength-selective reflector being positioned in the path of incident rays towards one of the single junction and multi junction photovoltaic cells so that the angle of incidence of said incident rays on said wavelength-selective reflector is greater than 0° and at most 35° and said wavelength-selective reflector is oblique to a light-receiving surface of said one photovoltaic cell that is in said path of incident rays;
wherein the combined efficiency of the multi junction and single junction photovoltaic cells under incoming incident sunlight is greater than the efficiency obtainable from the same multi junction cell on its own.

15. The photovoltaic device of claim 14, wherein at least 90% of the incident rays have an angle of incidence on said wavelength-selective reflector in the range from 20° to 30°.

16. The photovoltaic device of claim 14, wherein said wavelength-selective reflector is formed by a single reflective surface is embedded into a solid dielectric optic.

17. The photovoltaic device of claim 14, further comprising:
a reflective surface positioned to receive said other light reflected by said wavelength-selective reflector and to further reflect said other light to the other of said single junction and multi-junction photovoltaic cells.

18. The photovoltaic device of claim 17, wherein said single junction and multi-junction photovoltaic cells are in a common plane.

19. The photovoltaic device of claim 17, wherein each of said single junction photovoltaic cell, said multi junction photovoltaic cell, and said wavelength-selective reflector is a single flat structure.

20. The photovoltaic device of claim 17, wherein said wavelength-selective reflector comprises a multi-layer interference filter.

21. A photovoltaic device comprising:
a multi junction photovoltaic cell;
a single junction photovoltaic cell, wherein the single junction photovoltaic cell has a band-gap intermediate between two of the band-gaps of the multi-junction cell;
a wavelength-selective reflector comprising a band-pass filter or block-band filter configured to distribute incoming incident light between the single junction and multi-junction photovoltaic cells by directing incoming incident light within its pass band or block band primarily to one of said single junction and multi-junction photovoltaic cells, and directing incoming incident light outside its pass band or block band primarily to the other of said single junction and multi junction photovoltaic cells; and
wherein the combined efficiency of the multi junction and single junction photovoltaic cells under incoming incident sunlight is greater than the efficiency obtainable from the same multi junction cell alone, without the reflector.

22. The photovoltaic device of claim 21, wherein said filter directs said incoming incident light within its pass band or block band substantially solely to said one photovoltaic cell, directs incoming incident light outside its pass band or block band on one side of said pass band or block band substantially solely to said other photovoltaic cell, and distributes incoming incident light outside its pass band or block band on the other side of said pass band or block band between said single junction and multi-junction photovoltaic cells.

23. The photovoltaic device of claim 21, wherein said filter is arranged to apportion light of different wavelengths between the multi junction and single junction photovoltaic cells such that with sunlight as the incident light the photocurrents from all four junctions are more nearly equal than the photocurrents of the three junctions of the multi-junction photovoltaic cell would be by itself receiving said incident incoming light.

24. The photovoltaic device of claim 21, wherein said multi junction photovoltaic cell is a Ge—Ga(In)As—GaInP triple junction cell and said single junction cell is a silicon cell.

* * * * *